(12) United States Patent
Yamashita et al.

(10) Patent No.: US 7,531,754 B2
(45) Date of Patent: May 12, 2009

(54) FLEXIBLE SUBSTRATE HAVING INTERLAMINAR JUNCTIONS, AND PROCESS FOR PRODUCING THE SAME

(75) Inventors: Yoshihisa Yamashita, Kyoto-fu (JP); Hiroki Yabe, Moriguchi (JP); Takashi Ichiryu, Moriguchi (JP); Seiichi Nakatani, Hirakata (JP); Satoru Tomekawa, Yokohama (JP); Toshio Fujii, Neyagawa (JP); Seiji Karashima, Hirakata (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/712,943

(22) Filed: Mar. 2, 2007

(65) Prior Publication Data

US 2007/0151756 A1 Jul. 5, 2007

Related U.S. Application Data

(62) Division of application No. 11/079,371, filed on Mar. 15, 2005, now Pat. No. 7,205,483.

(30) Foreign Application Priority Data

| | | | |
|---|---|---|---|
| Mar. 19, 2004 | (JP) | | P2004-079848 |
| Mar. 25, 2004 | (JP) | | P2004-088853 |
| Mar. 25, 2004 | (JP) | | P2004-088854 |
| Nov. 2, 2004 | (JP) | | P2004-318887 |
| Nov. 2, 2004 | (JP) | | P2004-318888 |

(51) Int. Cl.
*H05K 1/00* (2006.01)

(52) U.S. Cl. ........................ 174/254; 174/262; 174/250; 174/255; 174/256; 174/258; 361/790; 361/795

(58) Field of Classification Search ............... 174/254, 174/262, 250, 255, 256, 258, 257, 260, 261, 174/263, 264, 265, 266; 361/748, 749, 750, 361/760, 790, 792, 795
See application file for complete search history.

(56) References Cited

U.S. PATENT DOCUMENTS 5,434,751 A * 7/1995 Cole et al. .................. 361/792

(Continued)

FOREIGN PATENT DOCUMENTS

EP 1 093 329 4/2001

(Continued)

*Primary Examiner*—Jeremy C Norris
*Assistant Examiner*—Hoa C Nguyen
(74) *Attorney, Agent, or Firm*—Wenderoth, Lind & Ponack, L.L.P.

(57) ABSTRACT

A flexible substrate comprises a film, a first insulating resin layer on a front face of the film, a second insulating resin layer on a rear face of the film, a front-sided wiring pattern embedded in the first insulating resin layer, and a rear-sided wiring pattern embedded in the second insulating resin layer. A surface of the front-sided wiring pattern is flush with a surface of the first insulating resin layer, and a surface of the rear-sided wiring pattern is flush with a surface of the second insulating resin layer. A part of at least one of the front-sided wiring pattern and the rear-sided wiring pattern is dented toward a part of the other of the at least one of the front-sided wiring pattern and the rear-sided wiring pattern such that a portion of the front-sided wiring pattern and a portion of the rear-sided wiring pattern are jointed to each other to form a junction.

11 Claims, 25 Drawing Sheets

U.S. PATENT DOCUMENTS

| | | | |
|---|---|---|---|
| 5,436,411 A * | 7/1995 | Pasch | 174/261 |
| 6,045,713 A | 4/2000 | Tamiya et al. | |
| 6,127,633 A * | 10/2000 | Kinoshita | 174/259 |
| 6,127,634 A | 10/2000 | Higashiguchi et al. | |
| 6,166,438 A | 12/2000 | Davidson | |
| 6,240,636 B1 | 6/2001 | Asai et al. | |
| 6,243,946 B1 | 6/2001 | Suzuki et al. | |
| 6,365,843 B1 * | 4/2002 | Shirai et al. | 174/262 |
| 6,486,394 B1 * | 11/2002 | Schmidt et al. | 174/36 |
| 6,548,767 B1 | 4/2003 | Lee et al. | |
| 6,580,036 B2 | 6/2003 | Kim et al. | |
| 6,972,382 B2 * | 12/2005 | Zollo et al. | 174/262 |
| 7,041,534 B2 * | 5/2006 | Chao et al. | 438/114 |
| 2001/0038145 A1 * | 11/2001 | Mashino | 257/707 |

FOREIGN PATENT DOCUMENTS

| | | |
|---|---|---|
| JP | 49-27866 | 3/1974 |
| JP | 52-71677 | 6/1977 |
| JP | 55-102291 | 8/1980 |
| JP | 3-201498 | 9/1991 |
| JP | 9-283881 | 10/1997 |
| JP | 10-256700 | 9/1998 |
| JP | 11-289277 | 10/1999 |
| JP | 2001-111189 | 4/2001 |
| JP | 2003-163422 | 6/2003 |

* cited by examiner

US 7,531,754 B2

FLEXIBLE SUBSTRATE HAVING INTERLAMINAR JUNCTIONS, AND PROCESS FOR PRODUCING THE SAME

This is a divisional of U.S. application Ser. No. 11/079,371, filed Mar. 15, 2005 now U.S. Pat. No. 7,205,483.

FIELD OF THE INVENTION

The present invention relates to a flexible substrate, and a process for producing the same. In particular, the present invention relates to a flexible substrate and a multilayer flexible substrate in which a part of a front-sided wiring pattern and a part of a rear-sided wiring pattern are jointed to each other in such a manner that they penetrate through a film, and also relates to a process for producing the same.

BACKGROUND OF THE INVENTION

Recently, not only is an electronics device becoming smaller, lighter and thinner, but also an electronic circuit is becoming high-speed processing. Therefore, it has been considerably required to achieve a miniaturization and a high frequency-wave performance of electronic components. For example, as to a portable electronics device such as a cellular phone, it is one of the most important challenges to achieve a smaller, lighter and thinner device (see Japanese Patent Kokai Publication No. 2003-163422, for example). Accordingly, it is needed that a miniaturization and a high frequency-wave performance are achieved by mounting various types of mounted-components with a short length of wiring at a high density.

In these circumstances, a flexible substrate which leads to achievement of a high-density mounting is getting much attention (see Japanese Patent Kokai Publication No. 2001-111189, for example). Hereinafter, a process for producing a conventional flexible substrate will be described with respect to FIGS. 1(a)-1(f).

First, as shown in FIG. 1(a), by use of a drill or laser machining, holes 502 for interlaminar connections are formed in an insulating sheet 501 being about 50 to 100 μm in thickness. Next, as shown in FIG. 1(b), the holes 502 are filled with a conductive paste 503 by performance of a printing method. Subsequently, as shown in FIG. 1(c), metal foils (i.e. copper foils) 504 are disposed on both surfaces of the insulating sheet 501, and thereafter the metal foils 504 are pressed in order to be stacked as shown in FIG. 1(d). After that, as shown in FIG. 1(e), resist films 505 having the same pattern as conductor circuits are formed on the metal foils 504. Subsequently, by using the resist films 505 as etch masks, a part of the metal foils 504 is etched away, followed by removing the resist films 505. As a result of that, a flexible substrate 500 having conductor circuits 506 is obtained as shown in FIG. 1(f).

Next, with respect to FIGS. 2(a)-2(c), a process for producing a conventional multilayer flexible substrate 550 will be hereinafter described.

First, as shown in FIG. 2(a), by using the flexible substrate 500 of FIG. 1(f) as a core substrate, insulating sheet 501a in which holes 502 thereof are filled with a conductive paste, as well as metal foils 504a, are stacked on that flexible substrate 500 in order to obtain a stacked substrate. Next, as shown in FIG. 2(b), resist films 505 are selectively formed on both surfaces of the stacked substrate. Subsequently, by using resist films 505 as etch masks, a part of the metal foils 504a is etched away, followed by removing the resist films 505. As a result of that, a multilayer flexible substrate 550 composed of four-layer conductor circuits is obtained as shown in FIG. 2(c).

As described above, an etching technique (i.e. a wet process) is employed for a purpose of forming the wire pattern in a case of a conventional production process. Therefore, an influence of an etchant on an insulating sheet is of concern. In this case, it was troublesome to perform washing and drying steps as a post-treatment. Furthermore, conventional wiring patterns formed by an etching technique are exposed to their surroundings on surfaces of a flexible substrate. This will cause a microcrack of the wiring patterns when the flexible substrate is folded, which will be far from satisfying in terms of a flexing life.

Considering that the conventional process comprises a step for forming through-holes and thereafter filling the through-holes with a conductive paste, such conventional production process is fundamentally the same as a process for producing a rigid substrate (i.e. typical print circuit). The above-mentioned step is cumbersome (because of taking about 3 hours), so it is desired to simplify or abbreviate it. However, it has been considered that such step is essential for producing a flexible substrate as well as a multilayer flexible substrate, and that it is therefore basically difficult to abbreviate it. Also, due to its consideration as an essential step, such step has been regarded as a matter of no concern. Therefore, there is no process for producing a flexible substrate and a multilayer flexible substrate with careful regard to the issues as described above.

Therefore, an object of the present invention is to provide a process for producing a flexible substrate and a multilayer flexible substrate wherein formation of through-holes and a filling of a conductive paste are abbreviated. Also, a further object of the present invention is to provide a flexible substrate and a multilayer flexible substrate as obtained by such process.

SUMMARY OF THE INVENTION

In order to achieve the object, the present invention provides a process (referred to also as "production process (I)") for producing a flexible substrate comprising a film, an insulating resin layer and a wiring pattern, the process comprising:
  (a) preparing a sheet member comprising,
    (i) the film,
    (ii) the insulating resin layer (i.e. electrically insulating resin layer) formed on each of a front face of the film and a rear face of the film, which face is opposite to the front face, and
    (iii) a front-sided wiring pattern embedded in the insulating resin layer formed on the front face of the film, and a rear-sided wiring pattern embedded in the insulating resin layer formed on the rear face of the film; and
  (b) pressing a part of at least one of the front-sided wiring pattern and the rear-sided wiring pattern into an interior of the sheet member so that a part of the front-sided wiring pattern and a part of the rear-sided wiring pattern are jointed to each other to form a junction. In addition, the present invention provides a flexible substrate obtained by such process (i.e. production process (I)).

Also, the present invention provides a process (referred to also as "production process (II)") for producing a flexible substrate comprising a sheet member and a substrate, the process comprising;

(a₁) preparing the sheet member comprising,
  (i) a film,
  (ii) an insulating resin layer formed on each of a front face of the film and a rear face of the film, which face is opposite to the front face, and
  (iii) a wiring pattern embedded in the insulating resin layer formed on the front face of the film,
(a₂) preparing the substrate having a wiring pattern formed on a front face thereof,
(b) stacking the sheet member on the substrate in such a manner that the insulating resin layer formed on the rear face of the film of the sheet member is contacted with the front face of the substrate, and thereafter a part of the wiring pattern of the sheet member is pressed toward the substrate so that the part of the wiring pattern of the sheet member and a part of the wiring pattern of the substrate are jointed to each other to form a junction. In addition, the present invention provides a flexible substrate obtained by such process (i.e. production process (II)).

Furthermore, the present invention provides a process for producing a multilayer flexible substrate wherein production process (I) and/or production process (II), as well as a step of stacking further another flexible substrate, are included. In addition, the present invention provides a multilayer flexible substrate obtained by such process.

A "junction (i.e. junction section)", which is formed due to a joint or dent, serves to electrically connect the front-sided wiring pattern and the rear-sided wiring pattern to each other. Therefore, the term "junction" is herein referred to also as "interlaminar junction".

As to a connection of the wiring patterns, production processes (I) and (II) do not require a formation of through-holes and a filling of a conductive paste. According to the present invention, wiring patterns may be connected to each other by use of a needle-like member or a roll member with protrusions, for example. In a case where the roll member with a plurality of protrusions is used as a pair of roll members, a plurality of interlaminar junctions can be formed when a sheet member passes through the pair of roll members. Therefore, it is possible for production processes (I) and (II) to employ a roll-to-roll process, which in turn leads to an improved producibility and mass production. This roll-to-roll process has an advantage of holding a sheet member easily while producing a flexible substrate.

Unlike in a case of filling with a conductive paste, an interlaminar junction prevents a discordance of an impedance between wiring patterns and vias (corresponding to interlaminar junctions of the present invention) because each interlaminar junction consists of the same material as the wiring patterns in a seamless state. Also, due to being the same material as that of the wiring patterns, there is no difference between a thermal expansion coefficient of each of the interlaminar junctions and that of the wiring patterns, which will lead to a better reliability in terms of connection.

Furthermore, a sheet member used in production processes (I) and (II) can be obtained by transferring a wiring pattern which is preliminarily formed on a carrier sheet to each insulating resin layer formed on the film. Thus, not by performance of a wet etching process but by performance of a dry process, sheet members can be prepared. In addition, a dry process can be performed for a purpose of obtaining an interlaminar junction by use of a needle-like member or a roll member. Therefore, as a whole, production processes (I) and (II) can be performed by performance of the dry process, which in turn leads to a simple production process that is easy to handle.

DETAILED DESCRIPTION OF THE PREFERRED EMBOIDIMENTS

Hereinafter, processes for producing a flexible substrate and a multilayer flexible substrate will be concretely described. In conjunction with that, the flexible substrate and the multilayer flexible substrate obtained by such processes will also be described concretely.

First of all, production process (I) of the present invention will be described. In FIG. (3), a cross-sectional view of a construction of a sheet member 10 used in step (a) is shown. Also, in FIGS. (4) and (5), cross-sectional and perspective views of a construction of obtained flexible substrate 100 are respectively shown.

Figure 3:
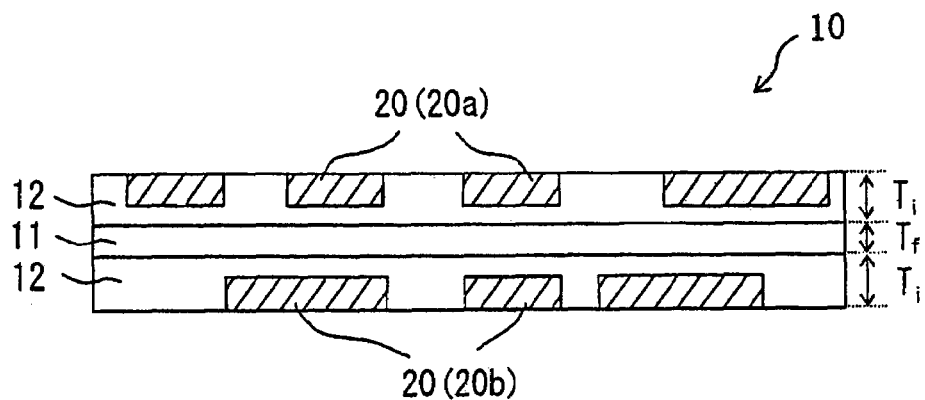
FIG. 3 shows a cross-sectional view of a construction of a sheet member used in production process (I) of the present invention.

As for step (a), sheet member 10 is prepared. As shown in FIG. 3, the sheet member 10 comprises:
 (i) film 11;
 (ii) insulating resin layers 12 formed on a front face and a rear face, opposite to the front face, of the film 11; and
 (iii) wiring patterns 20 embedded into the insulating resin layers 12.

It is preferred that the film 11 is thinner than each insulating resin layer 12. For example, a ratio of film (11) thickness/insulating resin layer (12) thickness is preferably 1.1 to 8, more preferably 1.2 to 6. As used in this specification, the phrase "insulating resin layer thickness" means a thickness of the insulating resin layer formed on one face of the film. Concretely, thickness $T_i$ of the insulating resin layer 12 is for example 3 to 80 μm, and thickness $T_f$ of the film 11 is 2 to 16 μm. In this way, due to a thin film 11 of the sheet member 10, interlaminar junctions are easy to form. In addition, because the wiring patterns 20 (20a, 20b) are buried in the insulating resin layers, a spacing between front-sided wiring pattern 20a and rear-sided wiring pattern 20b is small. Thus, the front-sided wiring pattern 20a and the rear-sided wiring pattern 20b are easy to joint to each other upon being pressed. For example, the spacing between the front-sided wiring pattern 20a and the rear-sided wiring pattern 2b is preferably 2 to 15 μm, more preferably 2 to 9 μm. Furthermore, in a case where the insulating resin layer 12 is thicker than the film 11, a sliding flexibility or a flexing life of the obtained flexible substrate is improved. A reason for this is that, when the flexible substrate is folded, stress applied on the film and buried wiring patterns is alleviated by the insulating resin layer having a low modulus of elasticity.

The film 11 is generally a resin film having an insulating characteristic, preferably a heat-resisting film. For example, the film 11 is a resin film made of an aramid or a polyimide. It is further preferred that an aramid film is used as the film 11. A reason for this is that the aramid film is better in terms of a surface flatness, a low absorptivity and a dimensional stability. Another reason for this is that, even in a case where the aramid film is thinner than a polyimide film, a given strength is easy to achieve, and that the aramid film is cheaper than the polyimide film. In addition to that, aramid has a high elasticity-strength so that it is suitable for forming a thin film. For example, about 4 μm of an aramid film thickness corresponds to about 12.5 μm of a polyimide film thickness.

The insulating resin layers 12 formed on both surfaces of the film 11 serve to house the wiring patterns 20. In order to improve an adhesion strength between the insulating resin layers 12 and the wiring patterns 20, or to improve an adhesion strength between multilayered substrates, it is preferred that the insulating resin layers 12 have an adhesive property.

Therefore, each insulating resin layer is preferably made of at least one resin material selected from the group consisting of an epoxy resin, a polyimide resin, and an acrylic resin and a modified resin thereof.

Figure 6A:
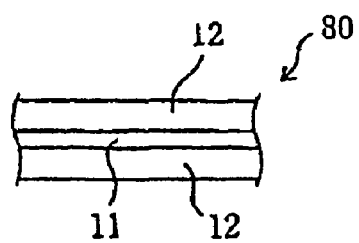
FIGS. 6(a) and 6(b) show cross-sectional views illustrating steps in a process for preparing a sheet member.
Figure 6B:
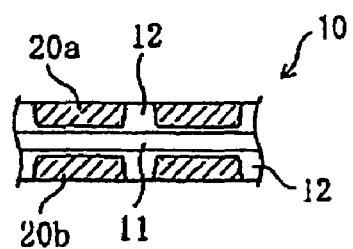
Figure 7:
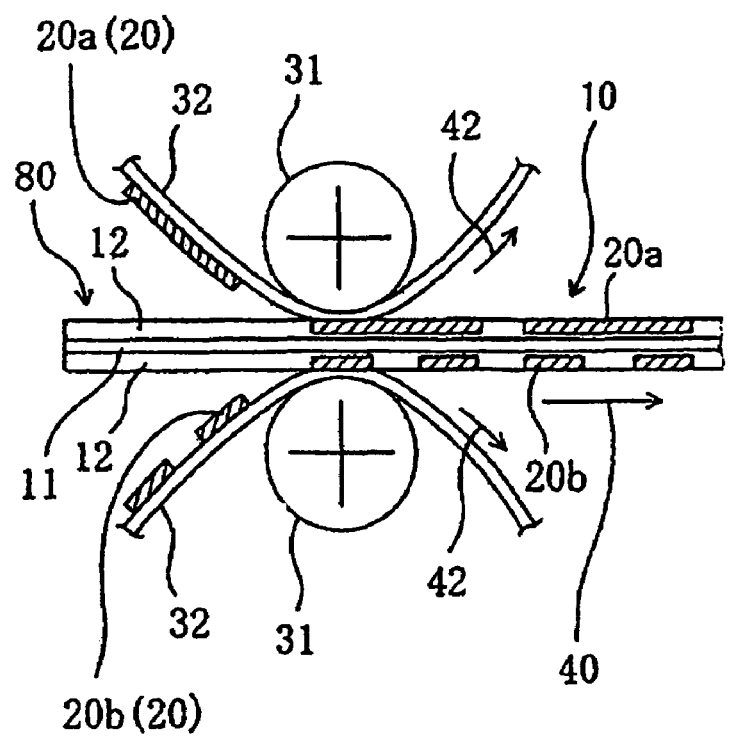
FIG. 7 shows a schematic cross-sectional view of a transferring technique.

The sheet member 10 used in a production process of the present invention is characterized in that the wiring patterns 20 are embedded in the insulating resin layers 12. For a purpose of obtaining these wiring patterns 20, first, a substrate 80 in which insulating resin layers 12 are formed on front and rear surfaces of a film 11 is prepared as shown in FIG. 6(a). Subsequently, wiring patterns 20a,20b are embedded into the insulating resin layers 12 as shown in FIG. 6(b). These operations are preferably performed by use of a transferring technique as shown in FIG. 7. As for such transferring technique, it is required to prepare carrier sheets 32 on which the wiring patterns 20a,20b are preliminarily formed. Also it is required to prepare a film 11 on both surfaces of which insulating resin layers 12 are formed. Subsequently, the carrier sheets 32 and the film 11 are conveyed in such a manner that they pass through a pair of roll members 31 rotating in a certain definite direction. As a result, these members are pressed due to a nip pressure of the pair of roll members 31. This causes the wiring patterns 20a, 20b formed on the carrier sheet 32 to be embedded into the insulating resin layers 12 formed on the film 11. As a result of that, by removing the carrier sheet 32 (including no wiring pattern), a sheet substrate 10 in which the wiring patterns 20a, 20b are buried in the insulating resin layers 12 is finally obtained. In a case of the insulating resin layers 12 being made of thermosetting resin, the insulating resin layers 12 are preferably kept in a semi-curing state during an embedding process. Preferably, the wiring patterns 20a,20 are buried in the insulating resin layers 12 in such a manner that surfaces of the wiring patterns 20a,20b are on the same level or approximately the same level as both surfaces of the insulating resin layers 12. That is to say, a surface of each of the wiring pattern 20a, 20b is flush with a surface of each of the insulating resin layers 12 formed on the front face and the rear face of the film 11. This results in a better flatness of the sheet member 10 and the obtained flexible substrate 100, which in turn leads to an advantage for a multilayering process of such substrates. Such a transferring process can provide a more fine-pitch wiring pattern than a wet etching process. For example, a line/space (L/S) of wiring patterns for the case of a wet etching process is 40 μm/40 μm, whereas a line/space (L/S) of wiring patterns for the case of the transferring process is very fine 15 μm/15 μm (i.e. 30 μm pitch).

The wiring patterns 20 may be made of any materials if they have electrically conductive properties. For example, it is preferred that the wiring patterns 20 are made of metal materials selected from the group consisting of copper, nickel, gold and silver. It is also preferred that the carrier sheet used in the transferring technique is made of organic films such as PET, or a metal foil such as a copper foil, and that it is therefore something like a sheet-like member which is about 25 to 200 μm in thickness.

Figure 4:
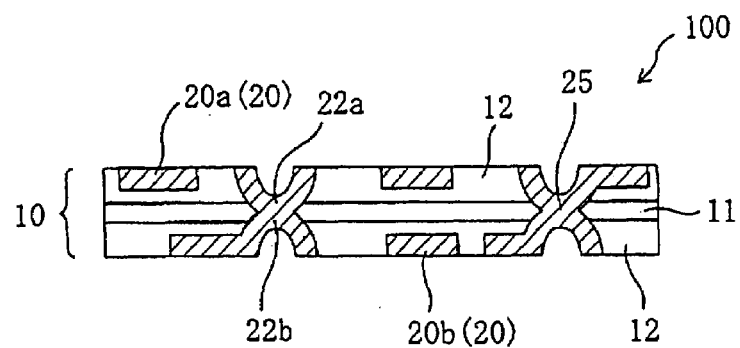
FIG. 4 shows a cross-sectional view of a construction of a flexible substrate obtained by production process (I) of the present invention.
Figure 5:
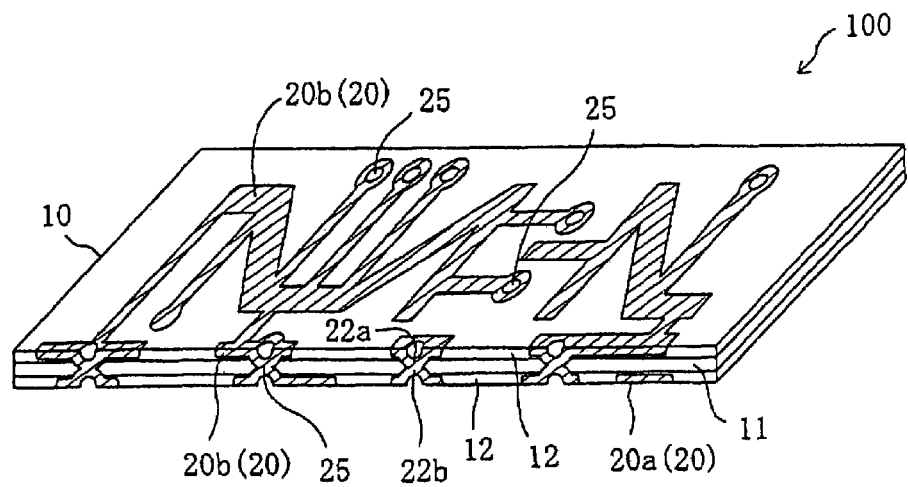
FIG. 5 shows a perspective view of a construction of a flexible substrate obtained by production process (I) of the present invention.

Next, step (b) will be hereinafter described. In step (b), a part of at least one of the front-sided and rear-sided wiring patterns is pressed into the sheet member in order to crash through the insulating resin layer(s) and film, and thereby a part of the front-sided wiring pattern and a part of the rear-sided wiring pattern are jointed to each other. This causes a part of the front-sided wiring pattern and a part of the rear-sided wiring pattern to be pressure-jointed to each other. Therefore, step (b) is herein referred to also as "pressure-joint step". However, it should be noted that if the front-sided wiring pattern and the rear-sided pattern are electrically connected to each other, it is no longer required to be pressed any more, and therefore the term "joint" does not necessarily mean the phrase "pressure joint" herein. It is preferred that a pressing direction is approximately perpendicular to a plane of the sheet member. In FIGS. 4 and 5, a junction (i.e. interlaminar junction) formed due to the above "joint" is indicated by number 25.

Figure 8:
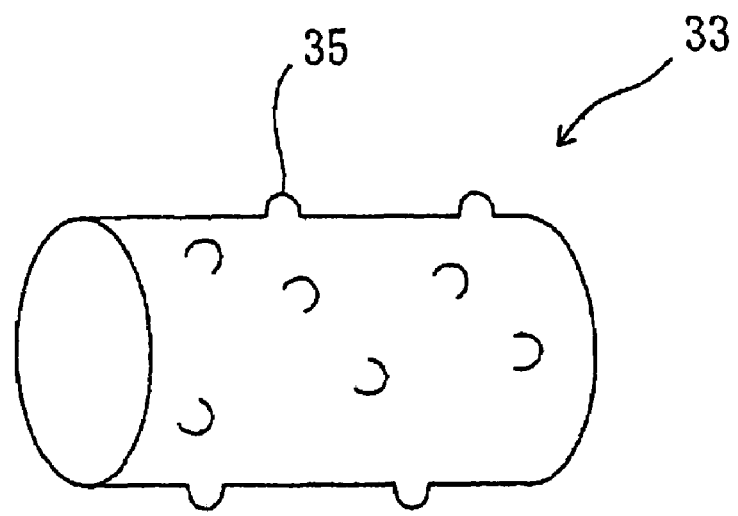
FIG. 8 shows a perspective view of a roll member with protrusions.
Figure 9:
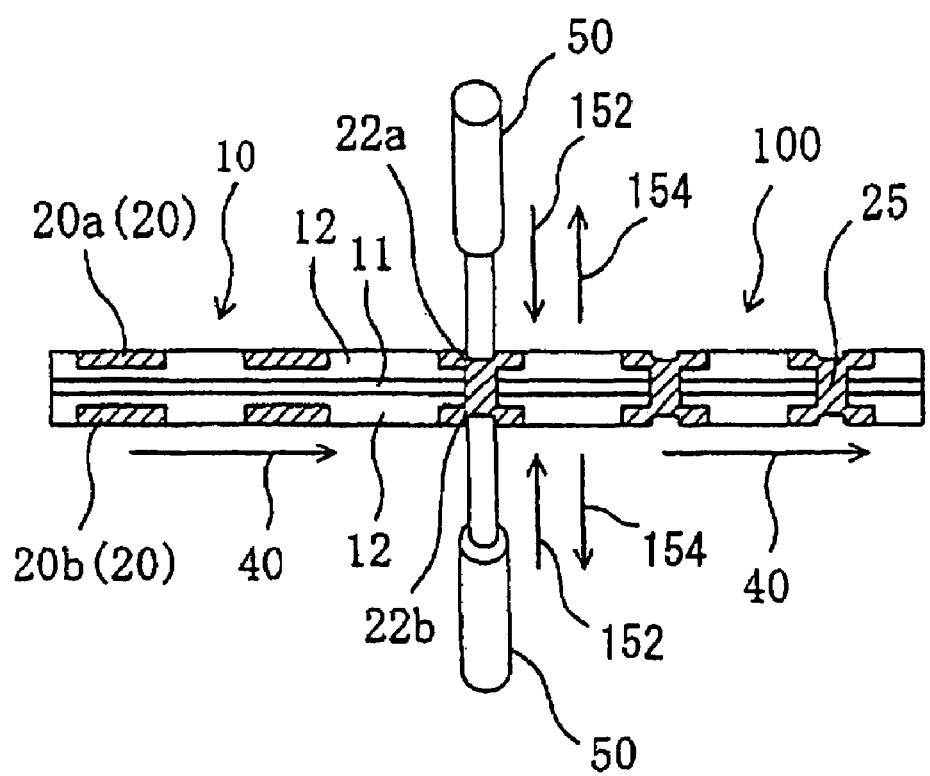
FIG. 9 shows a cross-sectional view of an embodiment wherein a flexible substrate is produced by use of a needle-like member 50.

As a pressing tool, a needle-like member, or a roll member 33 with protrusions 35 (see FIG. 8) may be used. In a case where the roll member is used, it is preferably used as a pair of roll members in order to utilize a nip pressure thereof. FIG. 9 shows an embodiment wherein the flexible substrate 100 is produced by use of needle-like member 50. It is preferred that a pressing portion (i.e. tip) of the needle-like member 50 is hemispherical in shape. However, a planar tip of the needle-like member 50 is permitted. Likewise, it is preferred that pressing portions of protrusions 35 of the roll member 33 are hemispherical in shape. However, planar tips of the protrusions 35 are also permitted. The needle-like member and the roll member are preferably made of a stainless material (i.e. SUS), nickel or aluminum and the like.

In a case where both of a portion of the front-sided wiring pattern and a portion of the rear-sided wiring pattern are pressed, a cross-sectional view of a wiring section composed of those portions is approximately "X" in shape. In contrast, in a case where one of a portion of the front-sided wiring pattern and a portion of the rear-sided wiring pattern is pressed, a cross-sectional view of a wiring section composed of a pressed portion is approximately "U" in shape.

In a case where both of a portion of the front-sided wiring pattern and a portion of the rear-sided wiring pattern are pressed, it could lead to an embodiment wherein a portion of the front-sided wiring pattern and a portion of the rear-sided wiring pattern are jointed to each other within an interior of the film. In some cases, it could lead to an embodiment wherein a portion of the front-sided wiring pattern and a portion of the rear-sided wiring pattern are jointed to each other within an interior of the insulating resin layer in such a manner that one of them penetrates through the film. Meanwhile, in a case where one of a portion of the front-sided wiring pattern and a portion of the rear-sided wiring pattern is pressed, it could lead to an embodiment wherein a portion of the front-sided wiring pattern and a portion of the rear-sided wiring pattern are jointed to each other in such a manner that a pressed portion of the wiring pattern only penetrates through the film.

A pressing operation of step (b) can be performed at normal temperature (e.g. 20 to 80° C.). A pressing force applied for each interlaminar junction is preferably 100 to 1200 gf, more preferably 500 to 1000 gf.

In step (b), in a case where a pressing operation is performed by use of the roll member with protrusions while the sheet member is moving unidirectionally, it is possible to form the interlaminar junctions continuously. Thus, it is possible to employ a roll-to-roll process in production process (I), which in turn leads to a mass production of the flexible substrate.

Figure 10:
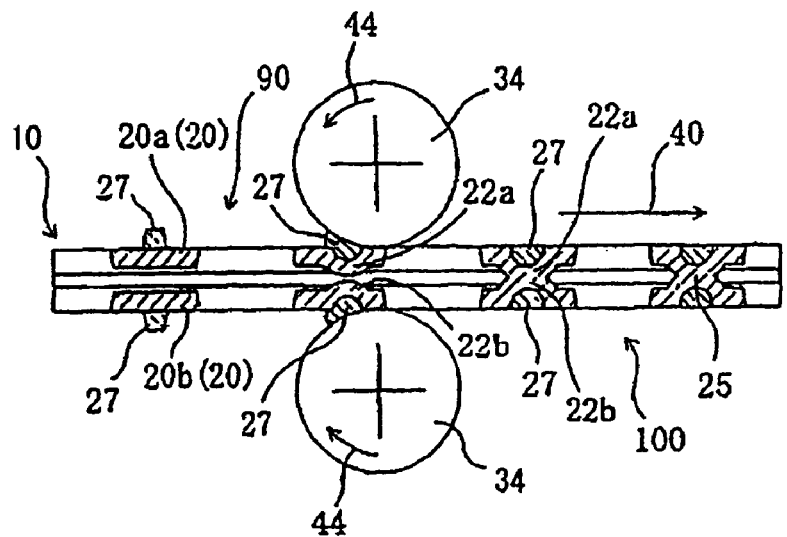
FIG. 10 shows a cross-sectional view of an embodiment wherein a flexible substrate is produced through an intermediary of conductive projecting members.

In a preferred embodiment, as shown in FIG. 10, conductive member 27 may be disposed on at least one of the front-sided and the rear-sided wiring patterns 20 in step (b) in such a manner that a disposed conductive member 27 projects from a surface of the wiring pattern. Thus, the conductive member is herein referred to also as "conductive projecting member". Pressing the conductive projecting member 27 causes at least one of a part 22a of the front-sided wiring pattern 20a and a part 22b of the rear-sided wiring pattern 20b to be indirectly pressed into the sheet member 10. Incidentally, as to the embodiment as shown in FIG. 10, conductive projecting members 27 are disposed on both of the front-sided wiring pattern 20a and the rear-sided wiring pattern 20b. That is, both of the front-sided wiring pattern 20a and the rear-sided wiring pattern 20b are pressed into the sheet member 10 through intermediary of the conductive projecting members 27.

Figure 11A:
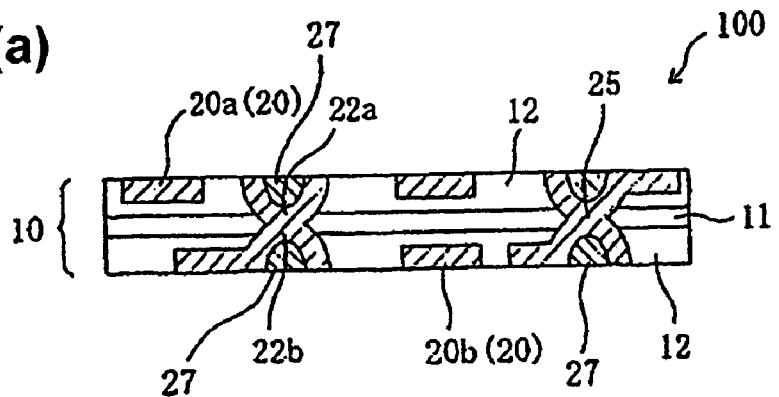
FIGS. 11(a) and 11(b) show cross-sectional views of embodiments wherein concave portions formed in a surface of a wiring pattern are filled with conductive members.
Figure 11B:
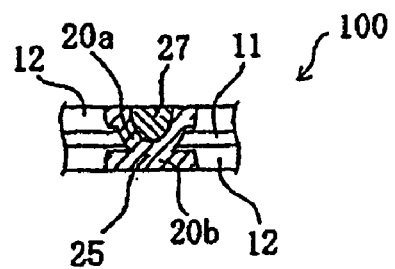

In such an embodiment that the conductive projecting members 27 are disposed, concave portions (i.e. depressed portions) in the surface of the wiring pattern, which portions are formed due to pressing, are supposed to be filled with the conductive members 27 so that the surface of each wiring pattern is flat, as shown in FIGS. 11(a) or 11(b). As a result, a surface of the flexible substrate 100 becomes flat, which in turn leads to a construction suitable for a multilayering process. In such flexible substrate 100, due to this filled conductive member 27, resistance of each interlaminar junction becomes low, which in turn allows a large electric current to pass therethrough if necessary.

Figure 12:
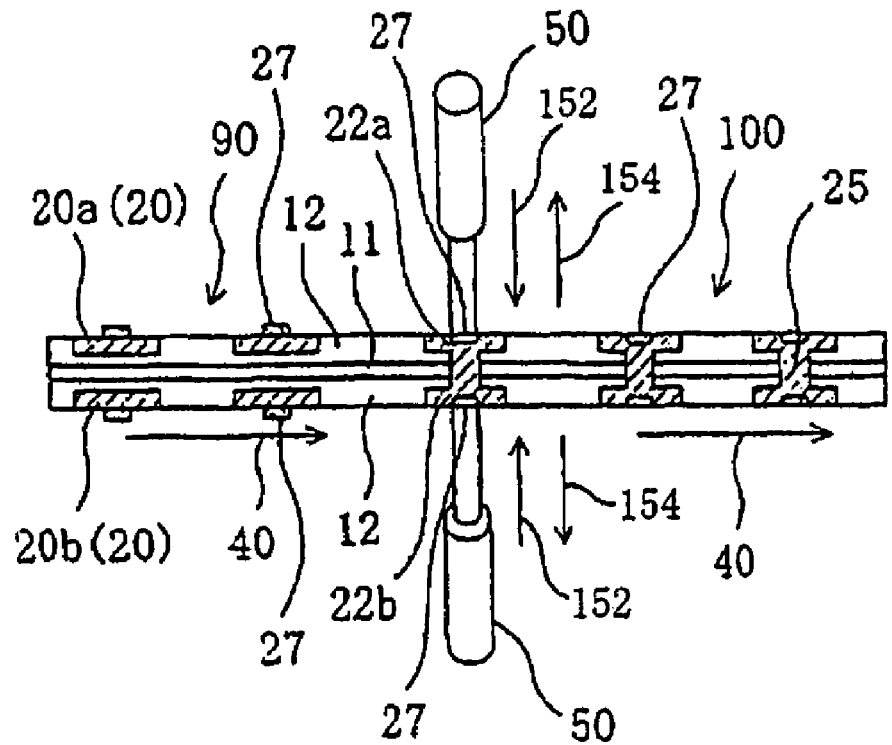
FIG. 12 shows a cross-sectional view of an embodiment wherein a flexible substrate is produced by use of a needle-like member as well as through an intermediary of a conductive projecting member.
Figure 13:
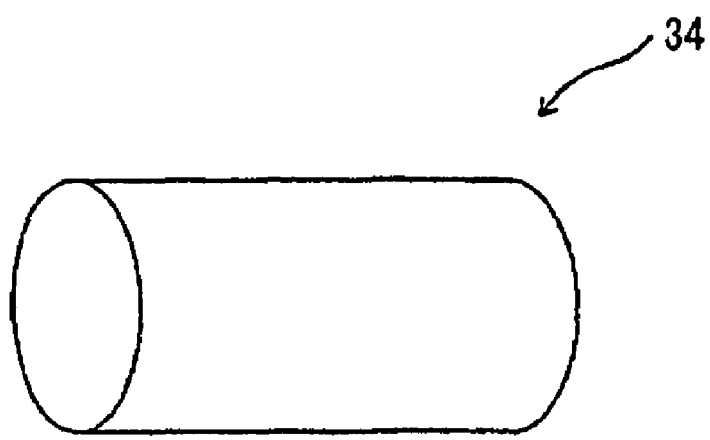
FIG. 13 shows a perspective view of a roll member without protrusions.

In a case where a part of the front-sided wiring pattern or a part of the rear-sided wiring pattern is pressed through the intermediary of the conductive projecting member, a needle-like member or a roll member may be used. FIG. 12 shows an embodiment wherein a part 22a of the front-sided wiring pattern 20a and a part 22b of rear-sided wiring pattern 20b are pressed by use of needle-like members 50 through intermediary of conductive projecting members 27. In a case where the roll member 34 is used, it is preferred that the roll member 34 is cylindrical in shape. In this case, it is also preferred that the roll member 34 is made of a material such as styrol material or rubber.

It is preferred that the conductive projecting member 27 is mainly made of a metal, for example an alloy. It is preferred that such alloy mainly consists of a metal selected from the group consisting of copper, nickel, aluminum, gold, silver and a combination thereof. Also, as a material of the conductive projecting member 27, a conductive paste which contains carbon powder or the above-mentioned metal in powder form may be used.

Figure 14:
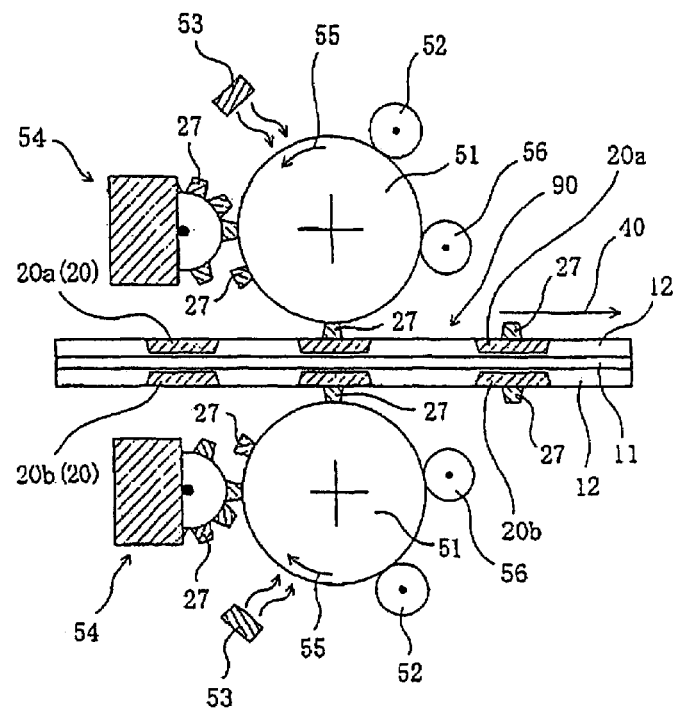
FIG. 14 shows a cross-sectional view of an embodiment wherein a conductive projecting member is formed by performance of an electrophotography technique.

In order to form the conductive projecting member 27, a paste printing technique, a bump forming technique, a ball mounting technique, or an electrophotography technique may be employed. That is, in a case of employing the paste printing technique, a projecting conductive member is formed by paste-printing a conductive material and thereafter drying it. In a case of employing the bump forming technique or the ball mounting technique, the conductive projecting members are formed by forming bumps on a metal layer, or mounting metal balls on a metal layer. As to the electrophotography technique, an embodiment thereof is shown in FIG. 14. In such electrophotography technique, subsequently to electrically charging a photoconductive drum 51 by use of an electrification device 52 (i.e. electrification roll), an electrostatic latent image is formed at a predetermined position of a photoconductive drum surface by performing an optical writing technique using a light source 53 (e.g. LED or laser). Subsequently, the conductive members 27 are attached to the photoconductive drum 51, and thereafter the conductive members 27 are transferred to a surface of a wiring pattern 20. As a result, the conductive projecting members 27 are formed on a surface of a sheet member.

In a case where the conductive projecting member is disposed on one of the front-sided wiring pattern and the rear-sided wiring pattern, not on both of them, a cross-sectional view of a portion of a wiring section composed of a pressed part of one of the front-sided wiring pattern and the rear-sided wiring pattern becomes approximately "U" in shape after pressing step (b) is performed with the roll member 34. Incidentally, not before pressing step (b) but there after, the conductive projecting member may be formed. That is, in order to achieve the flat surface of the wiring pattern as well as a low resistance of the interlaminar junction, the concave portion on the surface of the wiring pattern, which portion is formed due to pressing step (b), may be filled with the conductive material.

Figure 15:
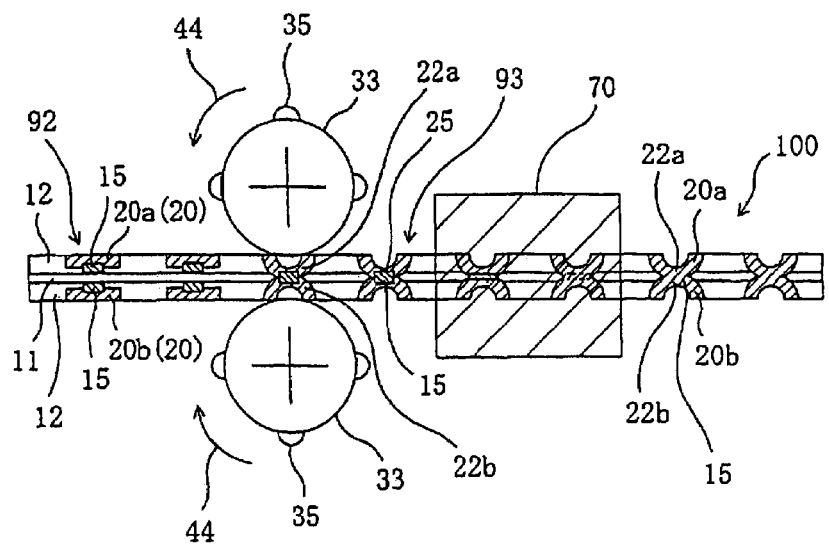
FIG. 15 shows a cross-sectional view of an embodiment wherein a flexible substrate is produced by disposing solder between a film and wiring patterns.

In a preferred embodiment of step (b), a part of the front-sided wiring pattern and a part of the rear-sided wiring pattern may be jointed to each other through an intermediary of solder. For example, as shown in FIG. 15, a sheet member 92 in which solder 15 is disposed between film 11 and wiring pattern 20 is pressed by use of roll member 33, so that obtained interlaminar junctions contain the solder 15. It is preferred that obtained sheet member 90 having interlaminar junctions is subjected to a reflow process using an oven 70. In a case where the solder is used in producing a flexible substrate 100, the solder is supposed to be additionally included in a junction composed of a part 22a of the front-sided wiring pattern 20a and a part 22b of the rear-sided wiring pattern, which will lead to a preferable reliability in terms of connection.

Figure 16:
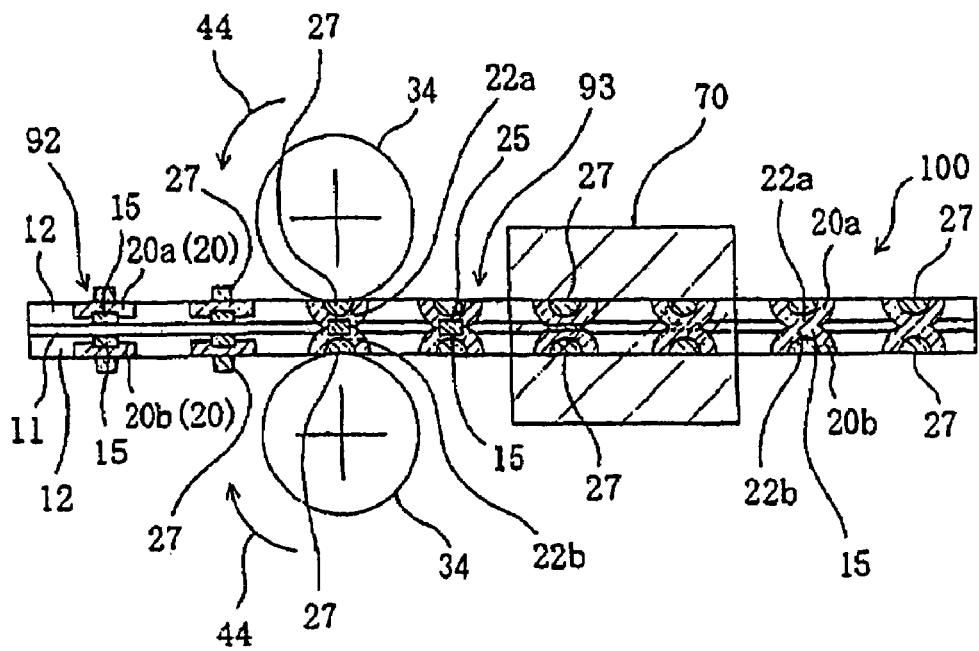
FIG. 16 shows a cross-sectional view of an embodiment wherein a flexible substrate is produced through an intermediary of conductive projecting members as well as solder.

As shown in FIG. 16, the solder 15 may be used even in a case where the interlaminar junctions are formed through an intermediary of conductive projecting members 27. In this case, such sheet member 92 with solder 15 disposed between the film 11 and the wiring patterns 20 is used, and the conductive projecting members 27 are disposed on the sheet member 92. Obtained flexible substrate 100 is better in terms of flatness and connecting reliability.

Figure 17:
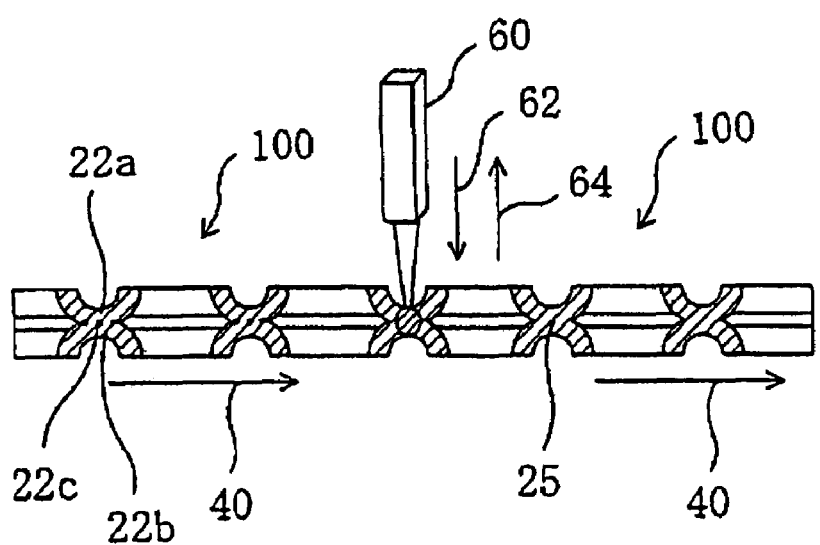
FIG. 17 shows a cross-sectional view of an embodiment wherein a welding appliance is used.

In a preferred embodiment, a heat treatment of joint-surface of a junction may be performed so as to improve a connecting condition of the junction. For example, as shown in FIG. 17, heat treatment of joint-surface 22c of junction 25 can be successively performed by moving a welding appliance up and down (i.e. a direction indicated by arrows 62 and 64) relative to a horizontal moving direction (i.e. a direction indicated by arrows 40) of flexible substrate 100. Instead of the heat treatment (i.e. a welding treatment), a laser machining treatment or an electric discharge machining may be employed.

Figure 18:
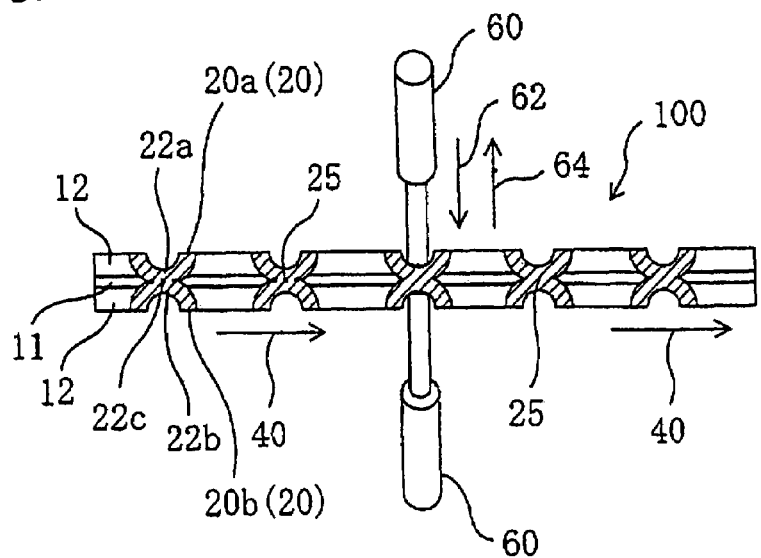
FIG. 18 shows a cross-sectional view of an embodiment wherein an ultrasonic wave is applied to junctions.

In particular, as shown in FIG. 18, it is preferred that an ultrasonic wave is applied to the junction 25. In the embodiment shown in FIG. 18, ultrasonic applying tools 60 are reciprocated in a direction (i.e. a direction indicated by arrows 62 and 64) that is approximately orthogonal to a moving direction of flexible substrate 100. This will cause the ultrasonic applying tools 60 and the flexible substrate 100 to contact and not contact one another repeatedly, which in turn leads to a repeated on-off of an ultrasonic wave application. This application of the ultrasonic wave causes an interlaminar junction (i.e. junction 25) to be ultrasonically bonded. As a result, strength of the interlaminar junction as well as connecting reliability is improved. Furthermore, in this case, resistance of the interlaminar junction 25 decreases because a region adjacent contact-surface 22c (i.e. boundary face) is melted due to the ultrasonic bonding. For example, the resistance of the interlaminar junction after the application of the ultrasonic wave is less than half the resistance before the application thereof. This enables a large electric current to pass through the junction, and also leads to a decrease of electric power consumption. It is preferred that a frequency of the ultrasonic vibration is about 15 to 150 kHz, and that the generating power is about 10 to a few thousand W. Also, it is preferred that an applying time is 0.1 to 10 seconds (typically about 1 second), which corresponds to applying energy of 1 to a few KJ.

Not only an embodiment wherein an ultrasonic wave is applied after formation of the interlaminar junctions is possible, but also an embodiment wherein the ultrasonic wave is applied during the formation of the interlaminar junctions is possible. In a case where the ultrasonic wave is applied during the formation of the interlaminar junctions, it is preferred that the needle-like member or the roll member having protrusions is used. In other words, pressing step (b) is performed by means of the needle-like member or roll member, both of which are respectively provided with a function of applying an ultrasonic wave. For example, as to the needle-like member, it is preferred that the tip of the needle-like member is provided with such function.

In a further embodiment, it is preferred that the interlaminar junctions are heated before or after being treated by an ultrasonic wave. This will cause a region adjacent the interlaminar junctions to soften, and thereby such region becomes easy to transform. As a result, a desirable ultrasonic bonding can be obtained due to a larger connecting area. The sheet member or the flexible substrate may be placed on a heated roll member or conveyor because a heating of the sheet member itself results in a heating of the interlaminar junctions. In this case, the sheet member or flexible substrate may be heated to for example 50 to 400° C., preferably 100 to 300° C.

It is preferred that the application of the ultrasonic wave is performed while measuring a physical characteristic of a part of the wiring patterns. For example, a measured physical characteristic is a resistance of a part of each wiring pattern, or a degree of a dent or depression of each wiring pattern. In a case where the application of the ultrasonic wave as well as the measurement of the physical characteristic (e.g. resistance) are concurrently performed, a strength characteristic of the interlaminar junction can be obtained in real time, which in turn allows the ultrasonic wave to be applied to such a degree that a desired strength characteristic is obtained. It is only necessary to perform measurement of the physical characteristic at first one time or a few times. That is to say, according to a result of such measurement, it is afterward possible to adjust an amount of the energy of the ultrasonic wave (e.g. an applying time or an amount of the ultrasonic wave).

Figure 19:
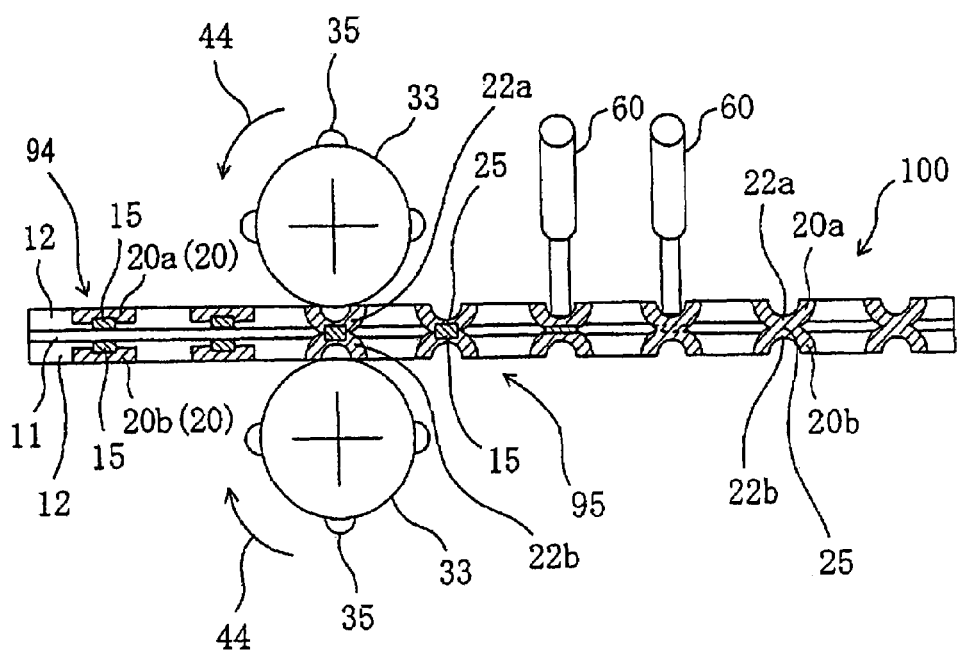
FIG. 19 shows a cross-sectional view of an embodiment for production of a flexible substrate wherein conductive members 15 are disposed on an inner side of a wiring pattern.

In a case where the ultrasonic wave is applied, conductive members 15 may be disposed on the inner side of the wiring patterns 20 in the sheet member 94 as shown in FIG. 19. It is preferred that the conductive member 15 is made of a metal selected from the group consisting aluminum, gold, silver, platinum and vanadium. If necessary, a solder may be contained in the conductive member 15.

According to the embodiment as shown in FIG. 19, a part of each of the front-sided and the rear-sided wiring patterns is pressed toward an interior of a sheet member 94 when the sheet member passes through the roll member 33. Therefore, the front-sided wiring pattern 20a and the conductive members 15 inside thereof, and the rear-sided wiring pattern 20b and the conductive members 15 inside thereof are jointed to each other. As a result of that, interlaminar junctions 25 including conductive members 15 are obtained. Subsequently, by use of the ultrasonic applying tool 60, the ultrasonic wave is applied to the sheet member having such interlaminar junctions 25 in order to ultrasonically bond the junctions 25. As for obtained flexible substrate 100, not only an alloy consisting of metals (e.g. copper) of the same kind, but also another alloy consisting of the metals of various kinds is contained in the junction, so that a strength of such junction is further improved. This will lead to achievement of a flexible substrate having a better reliability in terms of connection.

Hereinabove, the production process (I) has been described. As shown in FIGS. 4 and 5, the flexible substrate obtained by such production process (I) comprises:

a film 11, insulating resin layer 12 formed on each of a front face of the film 11 and a rear face of the film 11, which face is opposite to the front face, and a front-sided wiring pattern 20a embedded in the insulating resin layer 12 formed on the front face of the film 11, and a rear-sided wiring pattern 20b embedded in the insulating resin layer 12 formed on the rear face of the film 11, wherein a part of at least one of the front-sided wiring pattern 20a and the rear-sided wiring pattern 20b is dented toward an interior of the flexible substrate in such a manner that it penetrates through the insulating layer 12 and film 11, so that a part 22a of the front-sided wiring 20a and a part 22b of the rear-sided wiring 20b are jointed to each other to form a junction.

Figure 1A:
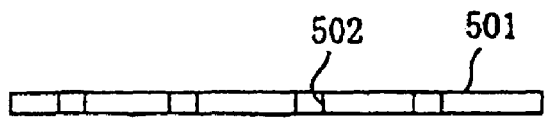
FIGS. 1(a) to 1(f) show cross-sectional views illustrating steps in a process for producing a conventional flexible substrate.
Figure 1B:
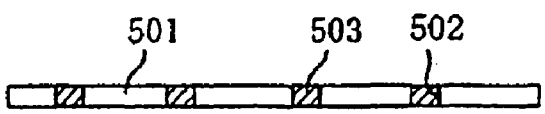
Figure 1C:
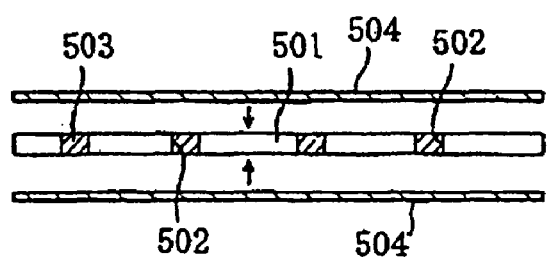
Figure 1D:
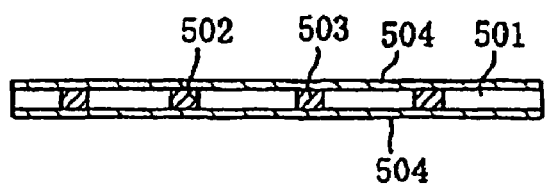
Figure 1E:
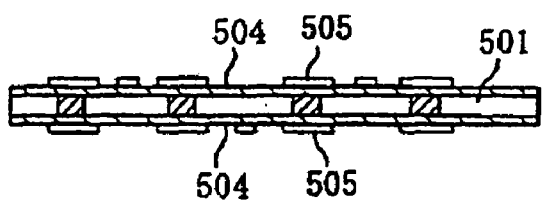
Figure 1F:
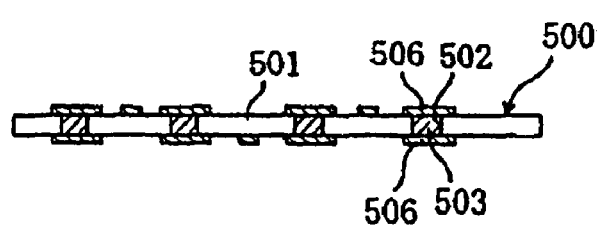
Figure 20:
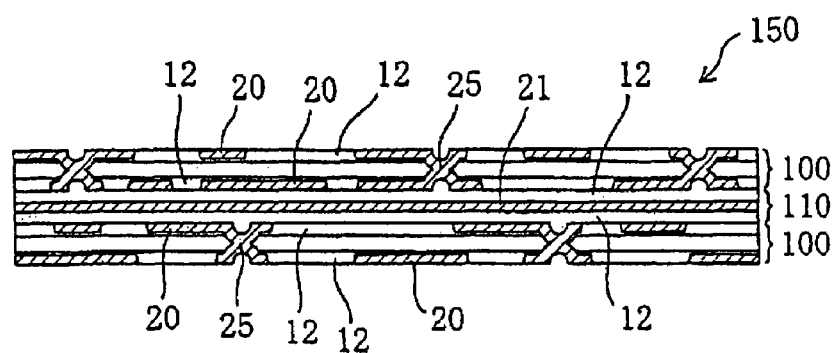
FIG. 20 shows a cross-sectional view of a construction of a multilayer flexible substrate including a flexible substrate.

By using this flexible substrate 100, it is possible to produce a multilayer flexible substrate 150 as shown in FIG. 20. In the multilayer flexible substrate 150 shown in FIG. 20, flexible substrates 100 obtained by the production process (I) are stacked on both surfaces of a flat layer 110 (i.e. mat-like layer) having a metal layer 21. Also, it is possible to stack typical substrates (e.g. substrates 500 as shown in FIG. 1(f)) on the flexible substrate 100 (serving as a core substrate) obtained by the production process (I). These multilayer substrates are characterized in that they are extremely thin. For example, in a case where the flexible substrate obtained by the production process (I) is 24 μm in thickness, a four-layer lamination thereof results in being less than 100 μm in thickness, and a six-layer lamination thereof results in being less than 150 μm in thickness. This will lead to achievement of a very thin multilayer flexible substrate.

Hereinafter, steps for producing a flexible substrate 100 of the present invention as well as a transferring step will be described with respect to FIG. 21.

Figure 21:
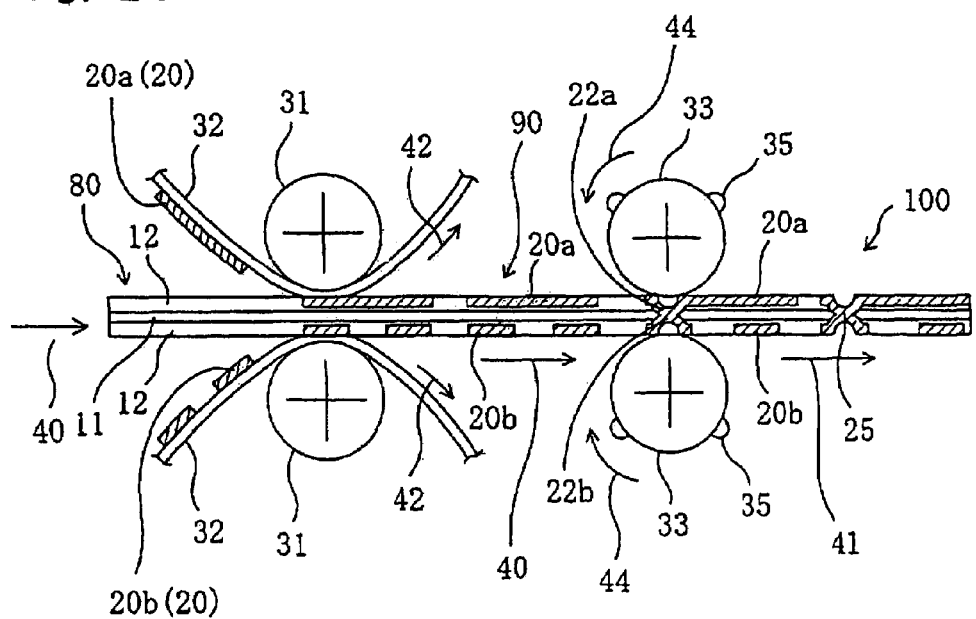
FIG. 21 shows a cross-sectional view illustrating steps in a process for producing a flexible substrate.

First, as shown in FIG. 21, a substrate 80 in which insulating resin layers 12 are formed on both surfaces of a film 11 is conveyed in a direction of arrow 40. When the substrate 80 passes trough a pair of roll members (i.e. nip rolls), wiring patterns 20 (i.e. 20a and 20b) are transferred to the insulating resin layers 12.

Before such transferring step, it is required that the wiring patterns 20 are disposed on carrier sheets 32. Due to a rotating of roll members 31, the carrier sheets 32 are conveyed toward a direction indicated by arrow 42. Thus, a nip pressure of the roll members 31 will cause the wiring patterns 20 (i.e. 20a and 20b) to be pressed toward the insulating resin layers 12 of the substrate 80, which will embed the wiring patterns 20 into the insulating resin layers 12.

After the wiring patterns 20 (i.e. 20a and 20b) are embedded, a sheet member 90 moving in a direction indicated by arrow 41 passes through a pair of roll members 33. As shown in FIG. 21, these roll members are provided with a plurality of protrusions in such a manner that the protrusions correspond to a pattern of an interlaminar junction (i.e. so-called "via") to be formed. Rotating (in a direction indicated by arrow 44) of the pair of roll members 33 causes a part 22a of the wiring pattern 20a and a part 22b of the wiring pattern 20b to be pressed toward an interior of the sheet member 90 upon contacting. As a result, the part 22a of the wiring pattern 20a and the part 22b of the wiring pattern 20b crash through the thin film 11 and thereby they are jointed to each other to form a junction.

Figure 22:
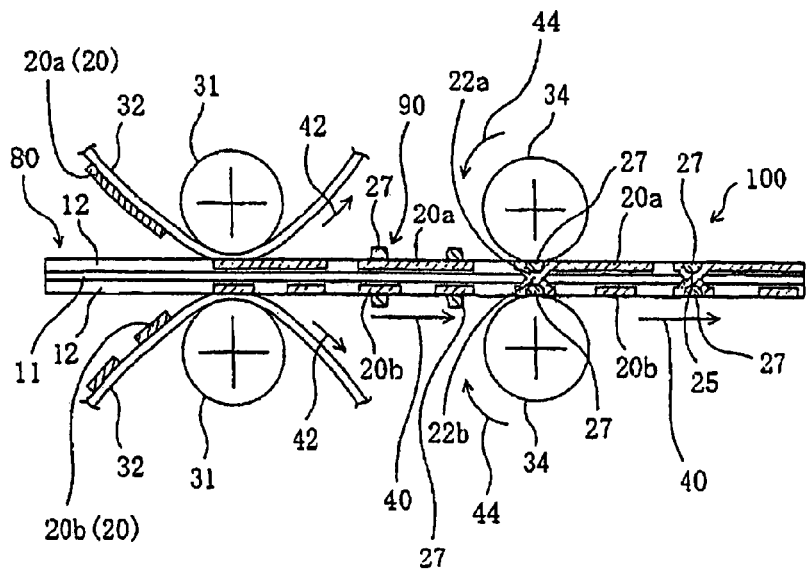
FIG. 22 shows a cross-sectional view illustrating steps in a process for producing a flexible substrate through an intermediary of conductive projecting members.

An embodiment wherein a part of each wiring pattern is pressed through an intermediary of a conductive projecting member is shown in FIG. 22. In the embodiment shown in FIG. 22, conductive projecting members are disposed between a transferring step and a pressure-joint step. A sheet member 90 on which conductive projecting members 27 are formed passes through a pair of roll members 34. The pair of roll members 34 rotates in a direction indicated by arrow 44. This causes a part 22a of wiring pattern 20a and a part 22b of wiring pattern 20b to be pressed toward an interior of the sheet member 90 through the conductive projecting members 27 when the members 27 are contacted with the roll member 34. As a result, the part 22a of the wiring pattern 20a and the part 22b of the wiring pattern 20b crash through thin film 11 and thereby they are jointed to each other. The conductive projecting members 27 which have been pressed toward the interior of the sheet member 90 by the pair of roll members 34 are supposed to be located in the concave portions formed in a surface of the wiring patterns. Therefore, obtained flexible substrate 100 becomes better in terms of surface flatness.

Figure 23:
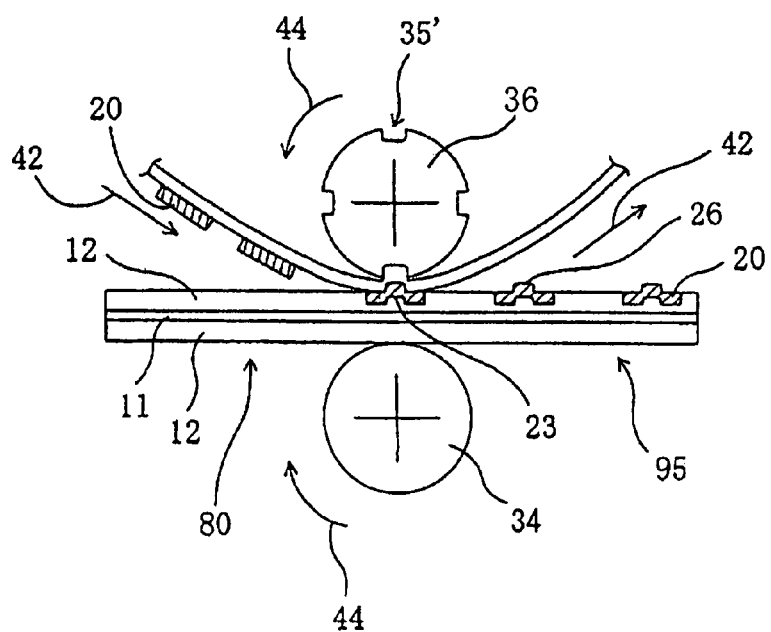
FIG. 23 shows a cross-sectional view of an embodiment wherein convex portions—are formed on a wiring pattern—by use of a roll member—with concave portions.
Figure 24:
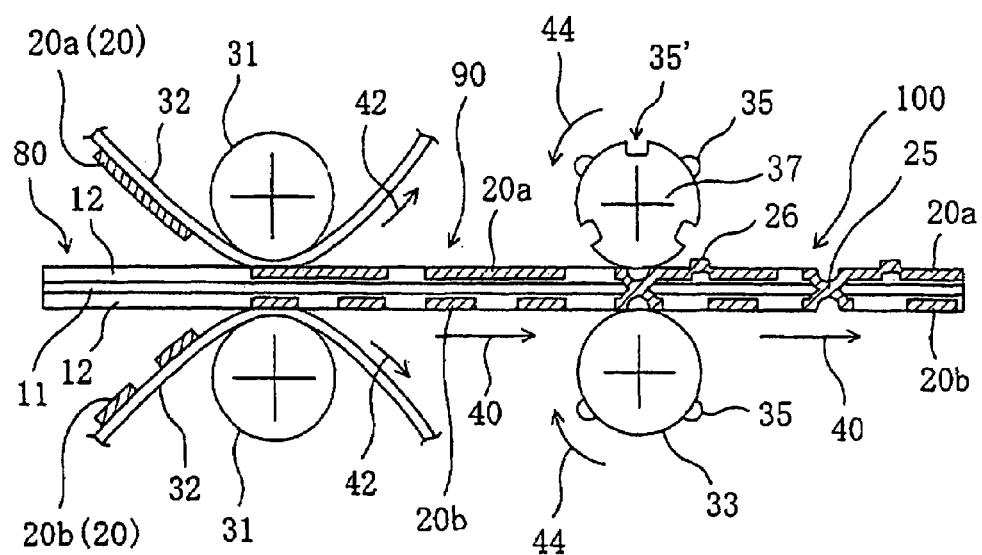
FIG. 24 shows a cross-sectional view of an embodiment wherein a flexible substrate is produced by use of a roll member with protrusions and concave portions.

In a preferred embodiment, as shown in FIG. 23, convex portions 26 may be formed on each wiring pattern by use of a roll member 36 with concave portions 35'. In this case, the convex portions 26 are formed by a bounce force due to a roll press, not by a press force due to the roll press. By use of the roll member 36, it is possible to form interlaminar junctions by using the obtained convex portions 26 as bumps. Also, as shown in FIG. 24, it is possible to employ a roll member 37 with protrusions 35 and concave portions 35'. In the embodiment shown in FIG. 24, by use of the roll member 37, convex portions 26 and interlaminar junctions are formed subsequently to a transferring step.

Figure 25:
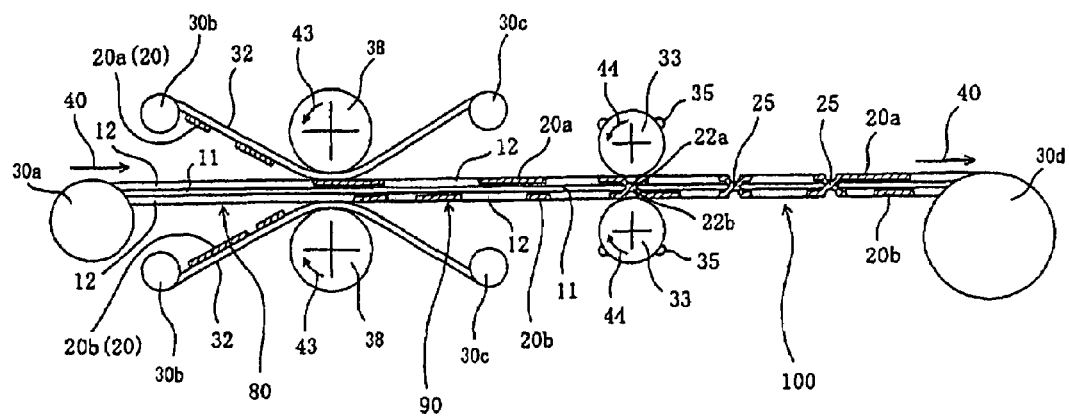
FIG. 25 shows a cross-sectional view of an embodiment wherein a flexible substrate is produced by performance of a roll-to-roll process.

Turning now to FIG. 25, a roll-to-roll process will be hereinafter described. FIG. 25 shows a step in a process for producing a flexible substrate 100 by performance of the roll-to-roll process. In this process, roll processes are performed from beginning to end. As shown in FIG. 25, prior to a transferring step, a substrate 80 is kept wound around a roll 30a. The substrate 80 is conveyed in a direction indicated by arrow 40 upon transferring of wiring patterns 20 and forming of interlaminar junctions 25. After the wiring patterns 20 are transferred and the interlaminar junctions 25 are formed, the obtained flexible substrate 100 is supposed to be finally wound around a roll 30d. Such roll-to-roll process is suitable for mass production because a flexible substrate and a multilayer flexible substrate are easy to hold and thereby those flexible substrates can be continuously produced. A reason why the production process of the present invention can employ the roll-to-roll process is that all the processes performed in such production process are dry processes.

Figure 26:
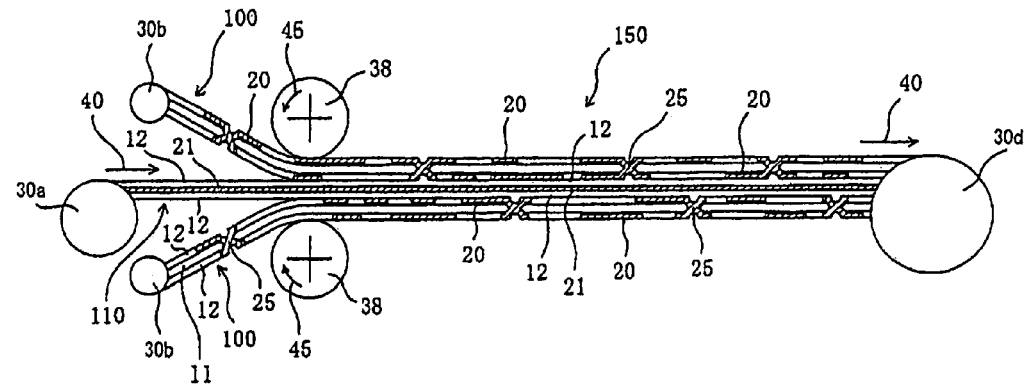
FIG. 26 shows a cross-sectional view of an embodiment wherein a multilayer flexible substrate is produced by performance of a roll-to-roll process.

An embodiment wherein a multilayer flexible substrate 150 is produced by performance of the roll-to-roll process using a flexible substrate 100 is shown in FIG. 26. In such embodiment, a film member 110 is used as a core substrate wherein insulating resin layers 12 are formed on both surfaces of flat metal layer 21 (i.e. flat copper foil) serving as a shield layer. From a roll member 30a, the film member 110 is conveyed in a direction indicated by arrow 40. From a roll member 30b, flexible substrates 100 are conveyed toward both sides of the film member 110. A pair of roll members 38 rotates in a direction indicated by arrow 45, so that the flexible substrates 100 and the film member 110 are pressed due to a nip pressure of the roll members 38. Obtained multilayer flexible substrate 150 is conveyed in the direction indicated by the arrow 40, and then is finally supposed to be wound around a roll 30d. Afterward, the multilayer flexible substrate 150 may be cut into a predetermined size, or may be subjected to a further multilayering process.

Figure 27:
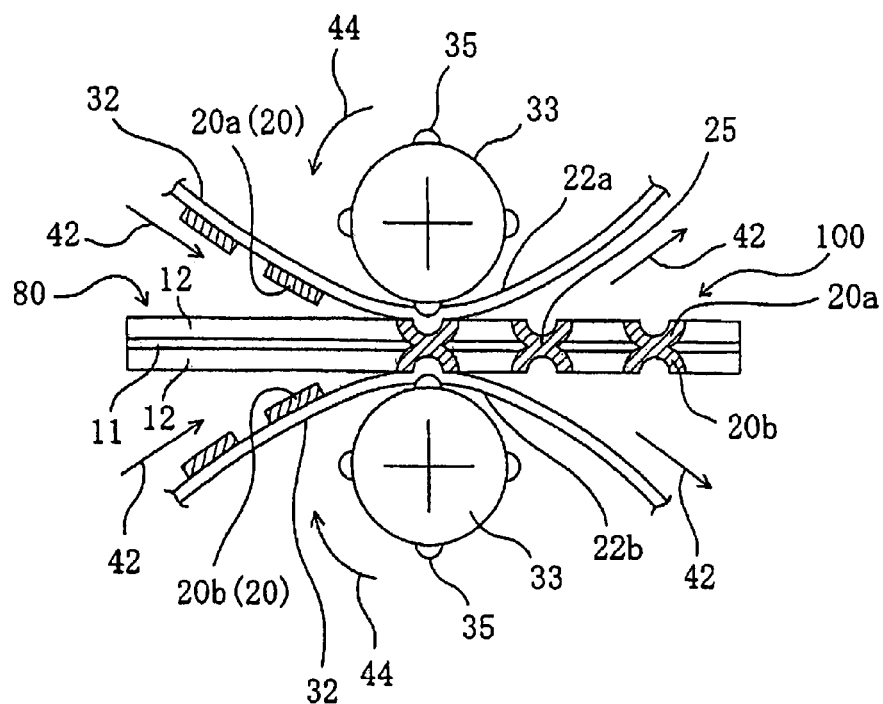
FIG. 27 shows a cross-sectional view of an embodiment wherein a transferring step of a wiring pattern and a pressure-joint step are concurrently performed.

In a preferred embodiment, a roll member 33 may be employed as shown in FIG. 27, so that a transferring step of a wiring pattern 20 and a pressure-joint step can be substantially concurrently performed. This will lead to achievement of a more efficient production process. In the shown embodiment, not only a substrate 80 but also carrier sheets 32 on which wiring patterns 20 are preliminarily formed pass through a pair of roll members 33. Thus, the wiring patterns 20 located on the carrier sheets 32 are embedded into the insulating resin layers 12, and concurrently a portion (22a, 22b) of each wiring pattern (20a, 20b) is pressed to form an interlaminar junction.

Hereinabove, the production process (I) of the present invention and the flexible substrate obtained thereby have been described. Next, a production process (II) of the present invention and a flexible substrate obtained thereby will be hereinafter described. The production process (II) comprises steps of;
(a$_1$) preparing a sheet member comprising,
  (i) a film,
  (ii) an insulating resin layer formed on each of a front face of the film and a rear face of the film, which face is opposite to the front face, and
  (iii) a wiring pattern embedded in the insulating resin layer formed on the front face of said film
(a$_2$) preparing a substrate having a wiring pattern formed on a front face thereof,
(b) stacking the sheet member on the substrate with adjustment of a position in such a manner that the insulating resin layer formed on the rear face of the film of the sheet member is contacted with the front face of the substrate, and thereafter a part of the wiring pattern of the sheet member is pressed toward the substrate so that the part of the wiring pattern of the sheet member and a part of the wiring pattern of the substrate are jointed to each other to form a junction.

Figure 28:
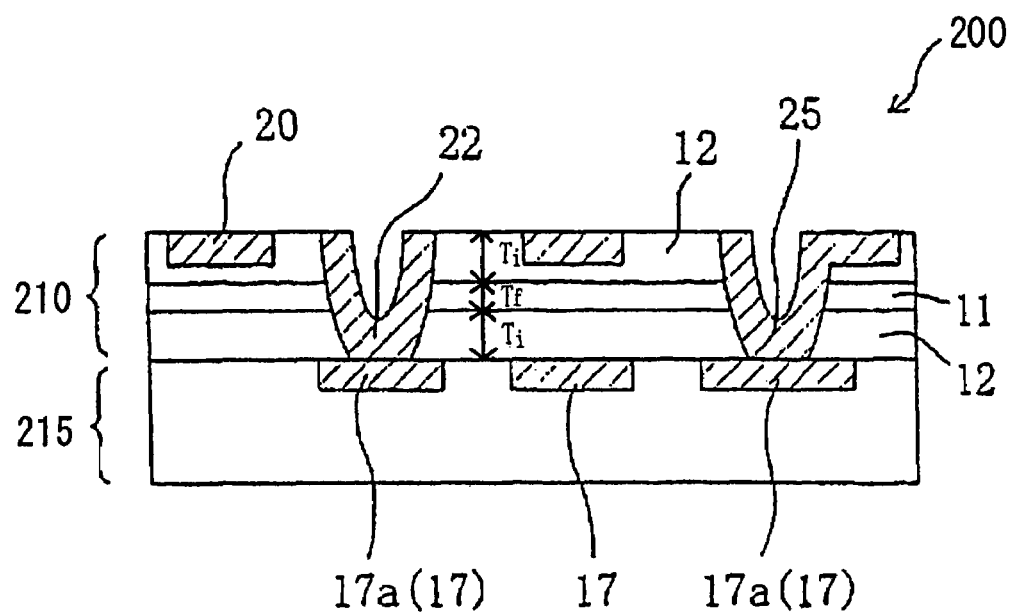
FIG. 28 shows a cross-sectional view of a construction of a flexible substrate obtained by production process (II) of the present invention.

FIG. 28 shows a cross-sectional view of a construction of a flexible substrate 200 obtained by the production process (II) of the present invention. The shown flexible substrate 200 comprises a sheet member 210 and a substrate 215 having a wiring pattern 17 formed on a front face thereof,
  wherein the sheet member 210 comprises
    a film 11,
    an insulating resin layer 12 formed on each of a front face of the film 11 and a rear face of the film 11, which face is opposite to the front face, and
    a wiring pattern 20 embedded in the insulating resin layer 12 formed on the front face of the film 11,
  the sheet member 210 is stacked on the substrate 215 in such a manner that the insulating resin layer 12 formed on the rear face of the film 11 of the sheet member 210 is contacted with a front face of the substrate 215,
  a part 22 of the wiring pattern 20 of the sheet member 210 is dented toward the substrate 215 so that a part 22 of the wiring pattern 20 of the sheet member 210 and a part 17a of the wiring pattern 17 of the substrate 215 are jointed to each other to form a junction.

In the embodiment shown in FIG. 28, the insulating resin layer 12 is formed not only on the front face of the film 11 but also on the rear face thereof. Front-sided insulating resin layer 12 serves to house wiring patterns 20, whereas rear-sided insulating resin layer 12 serves to improve an adhesive bonding between the sheet member 210 and the substrate 215. Therefore, only in terms of housing the wiring patterns 20, it is only necessary to form the insulating resin layer 12 on one face of the film 11. However, in terms of an adhesive bonding between the sheet member 210 and the substrate 215, it is additionally required to form the insulating resin layers 12 on both faces of the film 11, as shown in FIG. 28.

As to the flexible substrate 200 obtained by the production process (II), a part 22 of the wiring pattern 20 of the sheet member 210 and a part 17a of the wiring pattern 17 of the substrate 215 are jointed to each other with pressure, as shown in FIG. 28. Junctions 25 formed due to the joint serve as so-called "interlaminar junctions".

It should be noted that the sheet member 210 prepared in the production process (II) is different from the sheet member 10 prepared in the production process (I) in that the wiring pattern is formed only on one face of the film in the sheet member 210 of the production process (II), whereas two wiring patterns are formed on both faces of the film in the sheet member 10 of the production process (I). Incidentally, the sheet member 210 may be referred to also as "flexible wiring layer" because it could be understood that the sheet member 210 is a flexible layer having the wiring patterns.

As for the sheet member 210, it is preferred that the film 11 is thinner than the insulating resin layer 12. For example, a ratio of film (ii) thickness/insulating resin layer (12) thickness is preferably 1.1 to 8, more preferably 1.2 to 6. As with the production process (I), the phrase "insulating resin layer thickness" means a thickness of an insulating resin layer formed on one face of the film 11. Concretely, thickness $T_i$ of the insulating resin layer 12 is 3 to 80 μm, and thickness $T_f$ of the thickness of the film 11 is 2 to 16 μm, for example. In this case, due to a thin film 11, the interlaminar junctions are easy to form therethrough. In addition, because the wiring pattern 20 is buried in the insulating resin layer 12, spacing between the wiring pattern 20 of the sheet member 210 and the wiring pattern 17 of the substrate 215 is small. Thus, the wiring pattern 20 of the sheet member 210 and the wiring pattern 17 of the substrate 215 are easy to joint to each other upon being pressed. For example, the spacing between the wiring pattern 20 of the sheet member 210 and the wiring pattern 17 of the substrate 215 is preferably 2 to 15 μm, more preferably 2 to 9 μm. As with the production process (I), in a case where the wiring pattern is embedded in the insulating resin layer 12 that is thicker than the film 11, a sliding flexibility or a flexing life of the obtained flexible substrate 200 is improved.

The film 11 is generally a resin film having an insulating characteristic, preferably a heat-resisting film. For example, the film 11 is a resin film made of an aramid or a polyimide. As with the production process (I), it is preferred that an aramid film is used as the film 11.

The insulating resin layer 12 serves to house the wiring pattern 20 as well as enhance an adhesion strength between multilayered substrates. Thus, it is preferred that the insulating resin layer has an adhesive property. Therefore, it is preferred that the insulating resin layer is made of at least one resin material selected from the group consisting of an epoxy resin, a polyimide resin, and an acrylic resin and a modified resin thereof, for example.

As to the sheet member 210 used in the production process (II) of the present invention, the wiring pattern is buried in the front-sided insulating resin layer 12. As with the production process (I), it is preferred that a transferring technique is employed to obtain the wiring pattern 20. Also, it is preferred that the wiring pattern 20 is made of material as described with respect to the production process (I).

The "substrate 215 having a wiring pattern 17 formed on a front face thereof" prepared in step ($a_2$) has flexibility. The substrate 215 is not limited if it has flexibility. Thus, a typical flexible substrate 500 as shown in FIG. 1(f) may be used as the substrate 215. Although only on one face of the substrate 215 shown in FIG. 28 the wiring pattern 17 is formed, another wiring pattern 17 may be additionally formed on another face thereof. In a case where a multilayer flexible substrate is produced, various types of flexible substrates are stacked on the substrate 215. That is to say, the substrate 215 serves as a base substrate (i.e. core substrate).

Next, step (b) of the production process (II) will be hereinafter described. In step (b), a part 22 of the wiring pattern 20 of the sheet member 210 is pressed toward the substrate 215 so that such part 22 penetrates through the insulating resin layers 12 and film 11. As a result, a part 22 of the wiring pattern 20 of the sheet member 210 and a part 17a of the wiring pattern 17 of the substrate 215 are jointed to each other. Prior to a pressing step, the sheet member 210 is stacked on the substrate 215 in such a manner that the rear-sided insulating resin layer 12 of the sheet member 210 is contacted with a front face of the substrate 215. In this case, an adjustment of position is performed in such a manner that the wiring pattern 20 of the sheet 210 is opposed to the wiring pattern 17 of the substrate 215.

As with the production process (I), a needle-like member or a roll member 33 with protrusions 35 (see FIG. 8) may be used as a pressing tool.

Figure 29:
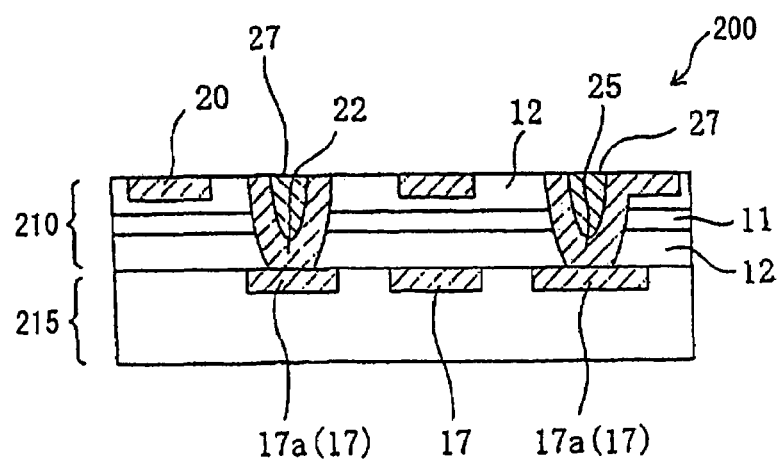
FIG. 29 shows a cross-sectional view of a construction of a flexible substrate in which concave portions thereof are filled with conductive members.

After a portion of the wiring pattern is pressed in step (b), a cross-sectional view of this pressed portion is approximately "U" in shape as shown in FIG. 28. As shown in FIG. 29, concave portions in a surface of the wiring pattern, which portions are formed due to pressing, may be filled with a conductive material 27 in order to flatten the surface of the wiring pattern. It is preferred that the conductive material 27 consists of material as described with respect to the production process (I).

Although the sheet member 210 is disposed only on one face of the substrate 215 in the examples shown in FIGS. 28 and 29, two sheet members 210 may be disposed on both faces of the substrate 215. Also, another sheet member 210 may be disposed on such sheet member 210. Because the flexible substrate 200 obtained by the production process (II) is better in terms of surface flatness, there is little possibility of a displacement of the wiring pattern. This will lead to an advantageous construction suitable for a multilayering process. As with the production process (I), the multilayer flexible substrate obtained by using the flexible substrate 200 is extremely thin.

Figure 30:
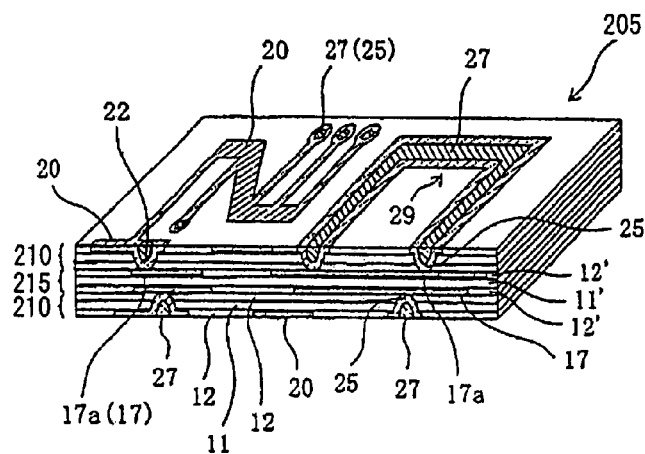
FIG. 30 shows a perspective view of an example of a multilayer flexible substrate.

FIG. 30 shows a perspective view of an example of a multilayer flexible substrate 205 in which the flexible substrate 200 obtained by the production process (II) is used. In the multilayer flexible substrate 205, sheet members 210 are formed on both surfaces of substrate 215. Interlaminar junctions 25 are composed of a part 17a of wiring pattern 17 formed on a surface of the substrate 215, and a part 22 of wiring pattern 20 of a corresponding sheet member 210. In this shown embodiment, concave portions in the surface of the wiring pattern, which portions are formed due to pressing or denting, are filled with a conductive material (i.e. conductive member). However, as a modified embodiment of the multilayer flexible substrate 205, no filling of conductive material is also possible.

As shown in FIG. 30, by using the interlaminar junctions 25, a closed region or approximately closed region 29 can be formed in the multilayer flexible substrate 205. As for a conventional method for making via holes, such closed region 29 is extremely hard to make because there is a possibility of falling of a central region. Thus, a structure of the closed region or approximately closed region 29 is peculiar to the multilayer flexible substrate 205 of the present invention. For example, the wiring patterns 20, which are connected to the interlaminar junctions that constitute the closed region or approximately closed region 29, may be used as a gland, whereas another interlaminar junction formed within the region 29 may be used for signal. This will allow the flexible substrate 205 to have a high tolerance for noise.

Figure 31:
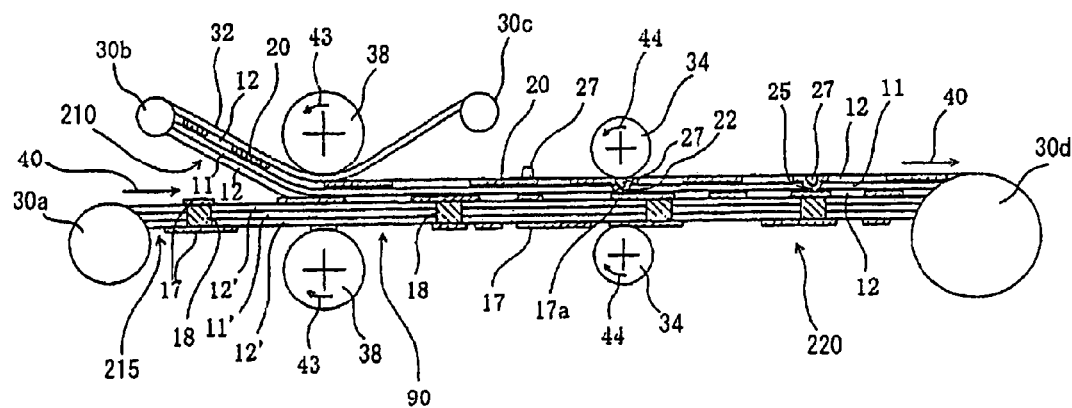
FIG. 31 shows a cross-sectional view illustrating steps in a process for producing a multilayer flexible substrate including a flexible substrate of the present invention.

Next, the production process (II) of the present invention will be hereinafter described with respect to FIG. 31. FIG. 31 schematically shows a process for producing a multilayer flexible substrate 220 including a flexible substrate 200 of the present invention.

Figure 32:
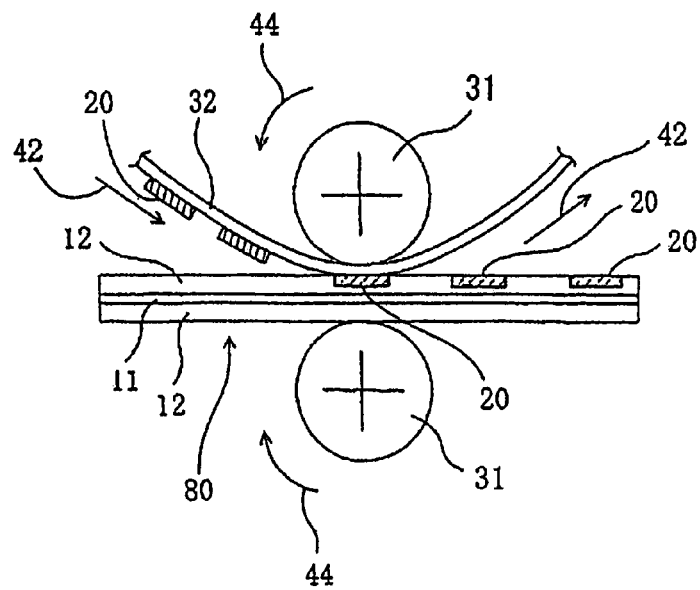
FIG. 32 shows a cross-sectional view of an embodiment of a transferring technique.

First, a sheet member 210 in which a wiring pattern is buried in an insulating resin layer 12 formed on a film 11 is prepared, and a substrate 215 having flexibility is also prepared. As to the substrate 215, wiring patterns 17 are formed on both surfaces thereof, and a front-sided wiring pattern 17 and a rear-sided wiring pattern 17 are electrically connected to each other through a via 18 (e.g. conductive paste portion). In this shown embodiment, a thermosetting adhesive layer 12' is disposed on an organic film 11' made of a polyimide, and wiring patterns 17 made of copper are formed on the thermosetting adhesive layer 12'. From a roll 30a, the substrate 215 is conveyed in a direction indicated by arrow 40. In contrast, the sheet member 210 superposed on a carrier sheet 32 is conveyed from a roll 30b. As shown in FIG. 32, the sheet member 210 may be preliminarily prepared by performance of a transferring technique similar to that of the production process (I).

As shown in FIG. 31, the substrate 215 and the sheet member 210 pass through a pair of roll members 38 (i.e. nip roll), so that the sheet member 210 is superposed on the substrate 215. During that, the wiring pattern 17 of the substrate 215 is embedded into the insulating resin layer 12 of the sheet member 210. The carrier sheet 32 serving to carry the sheet member 210 is supposed to be finally wound around a roll 30c.

Subsequently, conductive members 27 are disposed on obtained stacked substrate 90 in such a manner that they project from a surface of the substrate 90. That is to say, the substrate 90 is provided with the conductive projecting members 27. Incidentally, the conductive projecting members 27 are formed on wiring pattern 20 in such a position that they align with a pattern of the interlaminar junctions (so-called "via"). As with the production process (I), each conductive projecting member 27 may be formed by performance of a paste printing technique, a bump forming technique, a ball mounting technique or an electrophotography technique.

Subsequently, stacked substrate 90 on which the conductive projecting members 27 are formed passes through a pair of roll members 34. This causes the conductive projecting members 27 to be pressed into an interior of the stacked substrate 90. As a result of that, interlaminar junctions are formed, and conductive members 27 are supposed to be located in the concave portions (formed due to pressing) in the surface of the wiring pattern. Concretely, when the roll members 34 are contacted with conductive projecting member 27, the conductive projecting member 27 is pressed toward the interior of the stacked substrate 90, and consequently a part 22 of the wiring pattern 20 of the sheet member 210 is pressed toward the interior of the stacked substrate 90. As a result, a part 22 of the wiring pattern 20 and a part 17a of the wiring pattern 17 of the substrate 215 are jointed to each other. Incidentally, due to the conductive projecting member 27 located in the concave portion in the surface of the wiring pattern, a surface flatness of the multilayer flexible substrate 220 can be achieved. Subsequently, this obtained multilayer flexible substrate 220 having the interlaminar junctions is conveyed in the direction indicated by the arrow 40, and then is supposed to be wound around a roll 30d, and finally cut into a predetermined size. In a case where a further multilayering process is performed, the obtained multilayer flexible substrate 220 may be subjected to a further superposing step.

Figure 33:
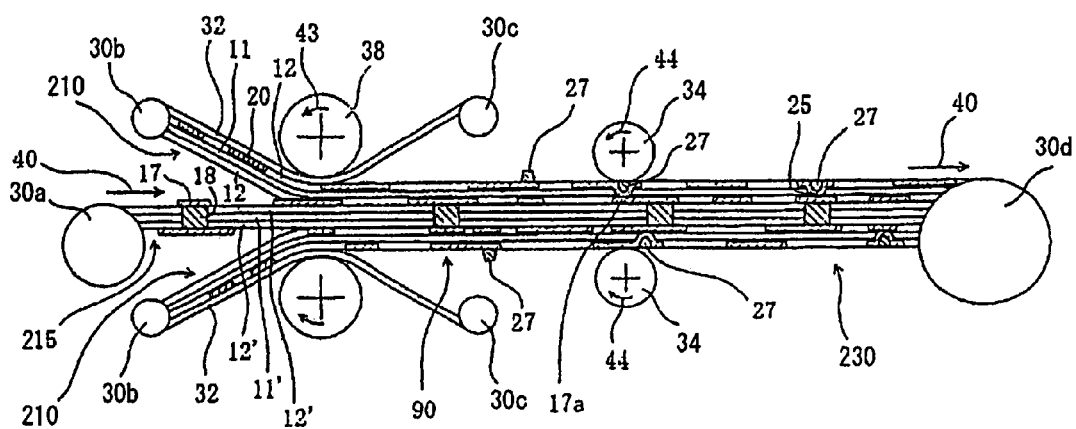
FIG. 33 shows a cross-sectional view illustrating steps in a process for producing a multilayer flexible substrate wherein sheet members are stacked on both sides of a substrate.

As for the embodiment shown in FIG. 31, the sheet member 210 is superposed on one side of the substrate 215. However, as shown in FIG. 33, two sheet members 210 may be superposed on the both sides of the substrate 215.

Figure 34:
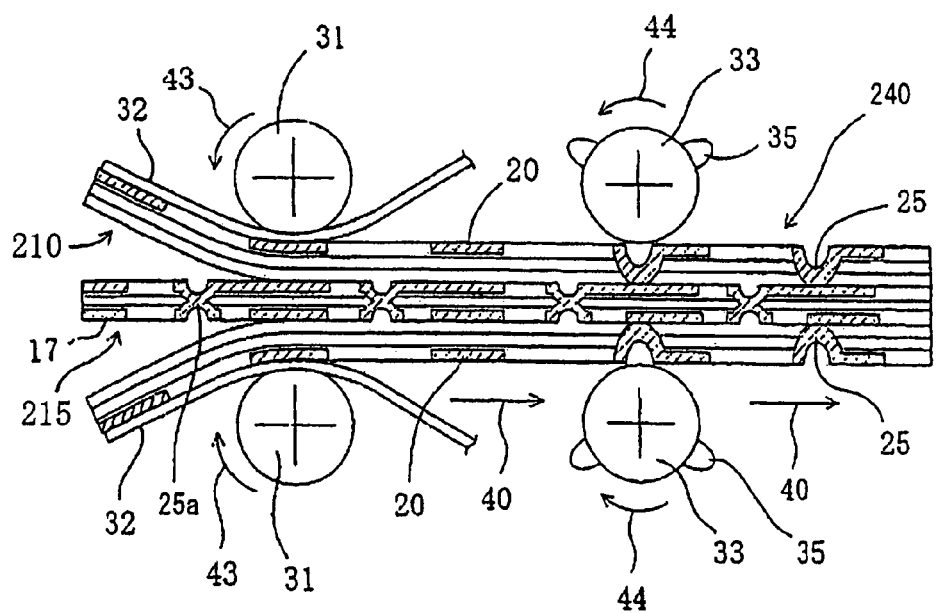
FIG. 34 shows a cross-sectional view of an embodiment wherein a pressure-joint step is performed by use of a roll member with protrusions.

Also, as for the embodiment shown in FIG. 31, a pressure-joint step is performed through an intermediary of the conductive projecting members as well as by use of the roll members 34 with no protrusions. However, as shown in FIG. 34, not through an intermediary of the conductive projecting members, but only by use of the roll members 33 with protrusions 35, a pressure-joint step may be performed.

Figure 35A:
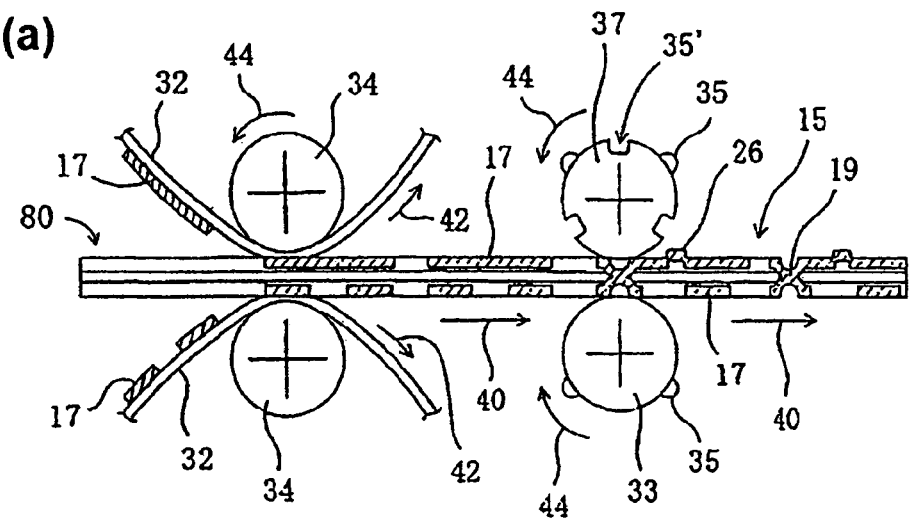
FIGS. 35(a) and 35(b) show cross-sectional views illustrating steps in a process for producing a multilayer flexible substrate wherein convex portions are formed on a wiring pattern.
Figure 35B:
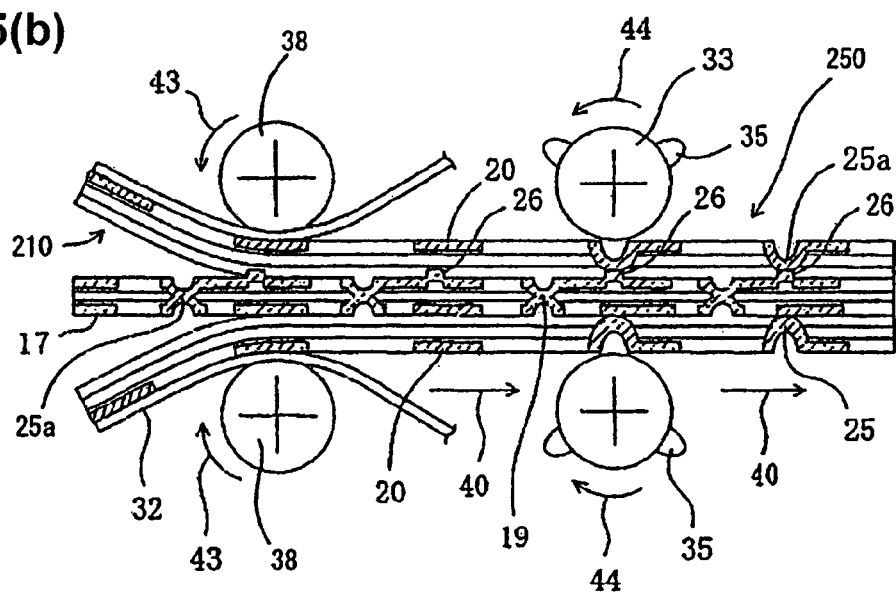

Furthermore, as shown in FIG. 35(a), convex portions 26 may be formed by use of a roll member 37 with concave portions 35' as well as protrusions 35, and subsequently by using obtained convex portions 26 as bumps, interlaminar junctions 25a may be formed as shown in FIG. 35(b).

Figure 36:
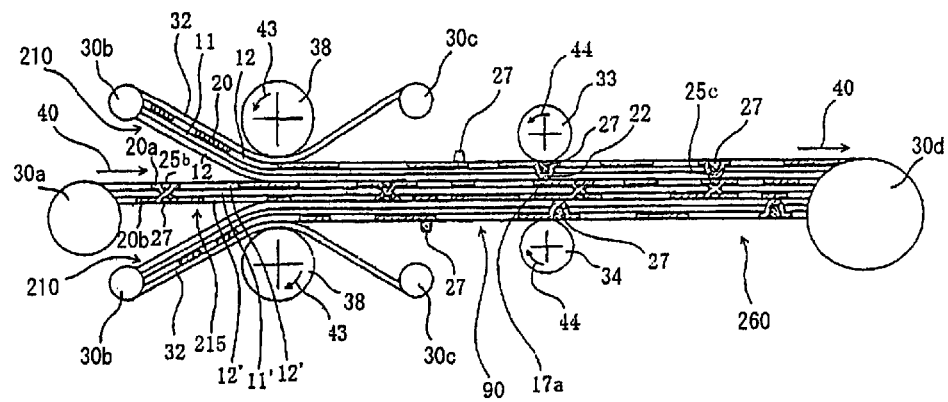
FIG. 36 shows a cross-sectional view illustrating steps in a process for producing a multilayer flexible substrate by using a flexible substrate.
Figure 37:
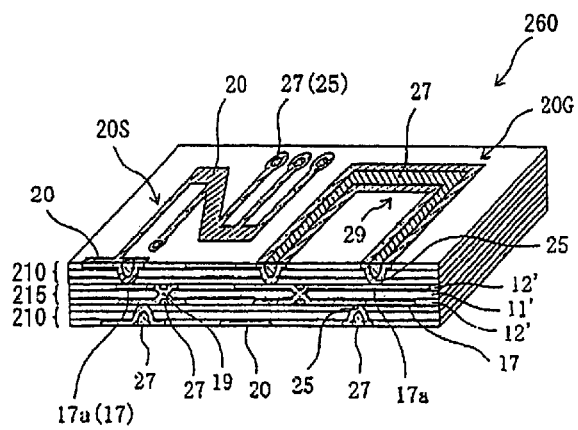
FIG. 37 shows a perspective view of a construction of a multilayer flexible substrate obtained by a production process shown in FIG. 36.

In the production process (II), the flexible substrate 100 as obtained by the production process (I) may be used as substrate 215 having flexibility. An embodiment of this case is shown in FIG. 36. As for a construction of the substrate 215 shown in FIG. 36, the wiring patterns are buried in insulating resin layers 12' formed on both surfaces of a film 11', and a part of front-sided wiring pattern 20a and a part of rear-sided wiring pattern 20b constitute interlaminar junction 25b. Additionally, in the embodiment shown in FIG. 36, concave portions formed due to interlaminar junctions 25b are filled with conducive material. Such substrate 215 will enhance merits of the production processes (I) and (II) because no through hole is required to be made in the sheet member 210 as well as in the substrate 215. FIG. 37 shows a structure of a multilayer flexible substrate 260 obtained by the production process shown in FIG. 36. The multilayer flexible substrate 260 shown in FIG. 37 corresponds to a modified flexible substrate 205 shown in FIG. 30 wherein a construction of the substrate 215 is changed. In the embodiment shown in FIG. 37, a wiring pattern located at a right side of a region where a conductive material 27 is filled may be used for a glad (20G), whereas a wiring pattern located at a left side thereof may be used for a signal (20S).

Figure 38:
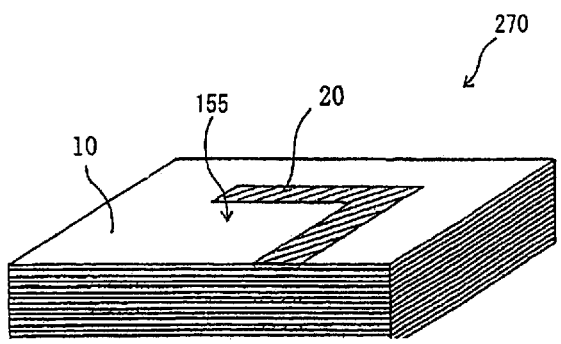
FIG. 38 shows a perspective view of a construction of a multilayer flexible substrate obtained by production process (II).
Figure 39:
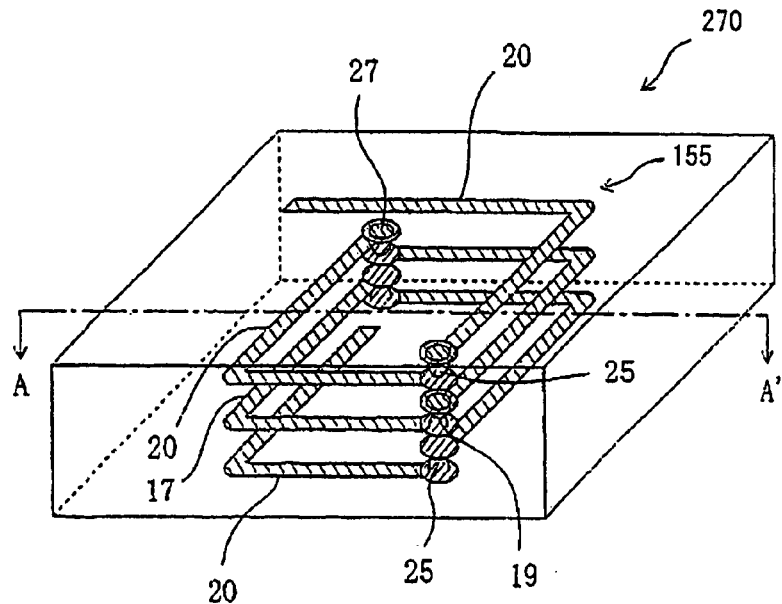
FIG. 39 shows a perspective view of a construction of a multilayer flexible substrate 270 wherein only wiring patterns 17, 20 are seen.

By suitably using the flexible substrate obtained by the production process (II), it is possible to construct a three-dimensional coil (i.e. inductor) as shown in FIGS. 38 and 39. FIG. 38 shows a cross-sectional view of a structure of a multilayer flexible substrate 270. FIG. 39 shows a perspective view of a multilayer flexible substrate 270 wherein only wiring patterns 17, 20 are seen. A cross-section along line A-A' in FIG. 39 corresponds to a cross-section of the multilayer flexible substrate 270 shown in FIG. 38. As for this shown embodiment, a stereoscopic coil (inductor) 155, not a planar coil, is composed of the wiring patterns 17,20 and interlaminar junctions 19, 25 within a thin multilayer flexible substrate 270. This coil 155 may be used as a inductor of an extremely thin device. Also, according to the embodiment as shown in FIGS. 38 and 39, an inductor with a low direct-current resistance can be obtained because the interlaminar junctions consist of the same material as wiring (i.e. wiring pattern). Furthermore, this three-dimensional coil 155 has an advantage in that a higher inductance value than that of a two-dimensional coil can be achieved. A reason for this is that, as for the three-dimensional coil 155, a large number of coil turns can be easy to achieve even when an available planar region of a surface is small.

According to production process (II), as with the production process (I), it is possible to form the interlaminar junctions easily without making through holes and filling conductive paste. This will lead to achievement of a simple production process of the flexible substrate. Also, as with production process (I), a so-called roll process (i.e. roll-to-roll process) can be employed in production process (II) because all processes performed in production process (II) are dry processes. Therefore, it is possible to produce multilayer flexible substrates continuously, which in turn leads to achievement of mass production.

Also, as with production process (I), aramid film, which has a higher elastic strength than polyimide film and therefore is suitable for forming a thin film, may be used in production process (II). This will lead to achievement of an extremely thin flexible substrate.

Furthermore, as with the production process (I), a transferring technique may be employed in production process (II). Therefore, it is possible to embed the wiring pattern 20 into the insulating resin layer 12 in such a manner that a surface of the wiring pattern 20 is on the same level (or approximately the same level) as a surface of the sheet member 210. That is to say, it is preferred that the surface of the wiring pattern 20 is flush with the surface of the sheet member 210. This will lead to achievement of a better flatness of the flexible substrate 200, and thereby a superposing process can be performed easily.

Hereinabove, production processes (I) and (II) as well as the flexible substrates 100 and 200 obtained thereby have been described.

Next, a process for producing a multilayer flexible substrate will be hereinafter described. Such process is characterized in that a multilayer flexible substrate is produced by using the flexible substrates 100 and 200 obtained by production processes (I) and (II) of the present invention.

Figure 40:
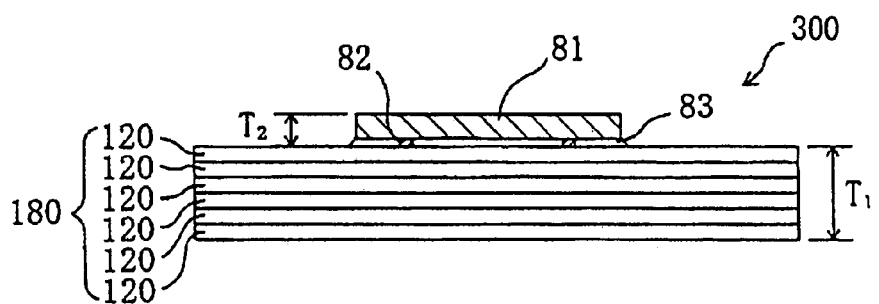
FIG. 40 shows a cross-sectional view of a construction of a flexible device.

FIG. 40 shows an example of a multilayer flexible substrate 180 in which six flexible substrates 120 are stacked on each other. At least one of the six flexible substrates 120 is the flexible substrate 100 or 200 as obtained by production processes (I) or (II).

Figure 41:
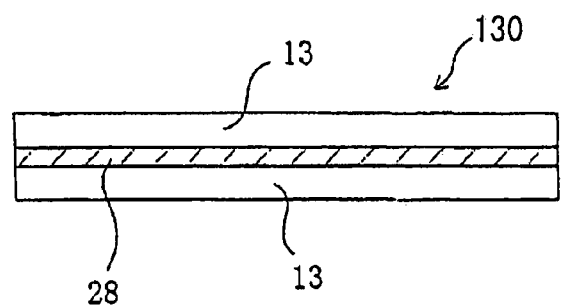
FIG. 41 shows a cross-sectional view of a construction of a flexible substrate including a flat metal layer.

In order to achieve a thin multilayer flexible substrate 180 (i.e. small thickness $T_t$), it is preferred that the flexible substrates 100, 200 are respectively 10 to 25 μm in thickness. Instead of using the flexible substrates 100,200, a typical flexible substrate (e.g. flexible substrate shown in FIG. 1(f)) or flexible substrate 130 having a flat metal layer 28 (see FIG. 41) may be used, for example. It is more preferred that more than and equal to half of the flexible substrates 120 are the flexible substrates 100, 200 obtained by production processes (I) or (II). Incidentally, as to two adjacent flexible substrates 120 that constitute such multilayer flexible substrate 180, an insulating resin layer of one of the flexible substrates 120 may serve as an insulating resin layer of the other flexible substrate 120. That is to say, it is a possible embodiment wherein there is only one insulating resin layer between respective films of adjacent flexible substrates 120.

As shown in FIG. 40, electronic components 81 (e.g. semiconductor chips) can be disposed on the multilayer flexible substrate 180, which in turn leads to achievement of a flexible device 300. In this shown embodiment, each semiconductor chip 81 is connected to a wiring pattern (not shown) through connecting members 82 (e.g. bump or solder). Also, in this embodiment, an underfill 83 is formed around a connecting portion of semiconductor chip 81.

In a case where thickness $T_2$ of the semiconductor chip 81 is for example 50 to 130 μm, and thickness $T_1$ of a six-layer flexible substrate (i.e. multilayer flexible substrate 180) is for example 75 to 150 μm, the flexible device 300 is as small as 125 to 280 μm in thickness ($=T_2+T_1$). Such an extremely thin flexible device 300 (i.e. less than and equal to 300 μm in thickness) serves many uses.

Figure 42:
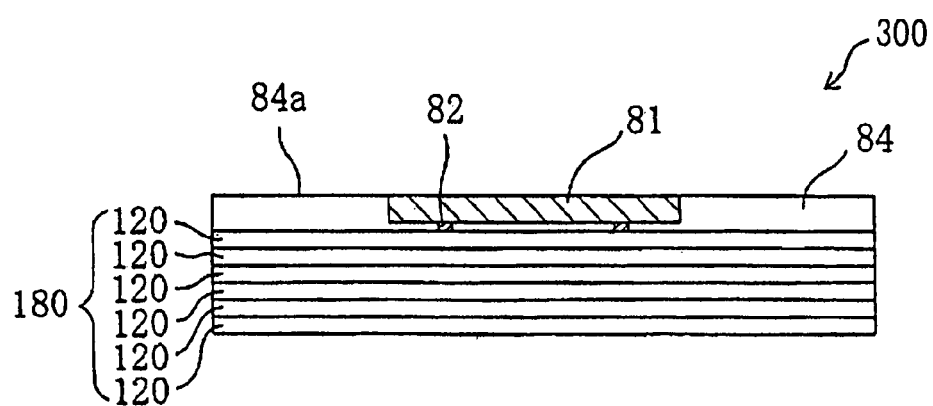
FIG. 42 shows a cross-sectional view of a flexible device including a composite sheet.

As shown in FIG. 42, it is possible to flatten a surface of the flexible device 300 where the semiconductor chip 81 is supposed to be mounted. In this embodiment shown in FIG. 42, a composite sheet 84 made of inorganic filler and resin is formed in such a manner that an upper surface thereof is on the same level as an upper surface of the semiconductor chip 81. A reason why such composite sheet 84 is employed is that an inorganic filler contained therein severs to radiate more heat, and that it is possible to prepare such composite sheet 84 in such a manner that a thermal expansion coefficient of the composite sheet 84 is the same as that of the semiconductor chip 81.

Incidentally, a flexible device 300 having wiring patterns (not shown) formed on a surface thereof can be obtained by transferring composite sheet 84 having the wiring patterns formed on a surface thereof to the multilayer flexible substrate 180. As to the flexible device 300, a preferable surface flatness is achieved, so that further electronic components can be mounted to a flat surface of the flexible device 300.

Figure 43:
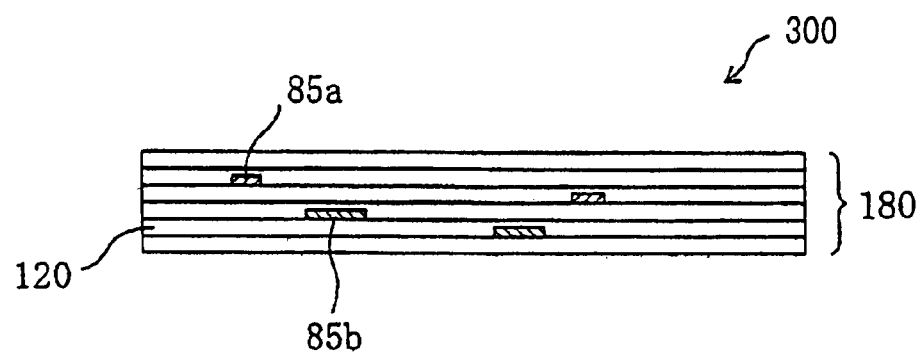
FIG. 43 shows a cross-sectional view of a construction of a flexible device including electronic components.
Figure 44A:
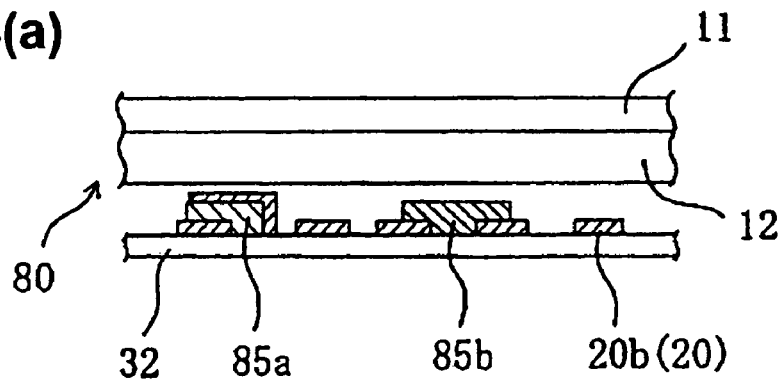
FIGS. 44(a) and 44(b) show cross-sectional views illustrating a step for disposing passive components within a flexible device.
Figure 44B:
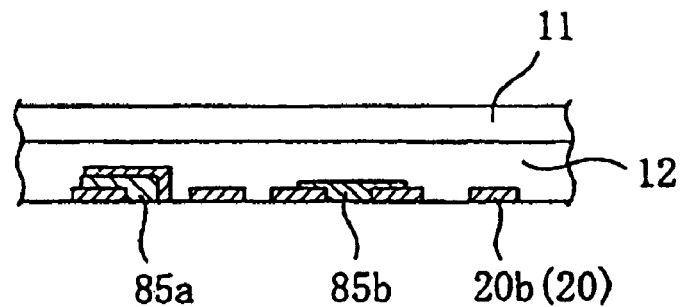

As shown in FIG. 43, it is possible to construct the flexible device 300 in such a manner that electronic components (e.g. passive components 85a, 85b) are included within the multilayer flexible substrate 180. For example, as shown in FIGS. 44(a) and 44(b), a transferring technique may be employed in order to include the passive components 85a, 85b within the multilayer flexible substrate 180. Concretely, first, wiring pattern 20 as well as passive component 85a (e.g. sheet-like capacitor formed by performance of a printing or thin-film sputtering technique) or passive component 85b (e.g. sheet-like resistor formed by the printing or thin-film sputtering techniques) is preliminarily disposed on a carrier sheet 32 as shown in FIG. 44(a). Subsequently, as shown in FIG. 44(b), the wiring pattern 20 as well as the passive components 85a, 85b are transferred to insulating resin layer 12 of substrate 80. As a result of that, a flexible device including the passive components can be obtained. As the passive components 85a, 85b, an inductor, a condenser, or a resistor may be used. Incidentally, even in a case where the substrate 80 is thin, electronic components are comparatively easy to include due to the fact that the insulating resin layer 12 is thicker than the film 11.

In order to make full use of characteristics of the flexible substrates 100, 200, the multilayer 180, or flexible devices 300, it is preferred that they are mounted to a thin compact electronics device or a compact electronics device wherein a mounting area is extremely limited. For example, as shown in FIG. 45, they may be mounted in electronics device 400 (e.g. cellular phone).

Figure 45:
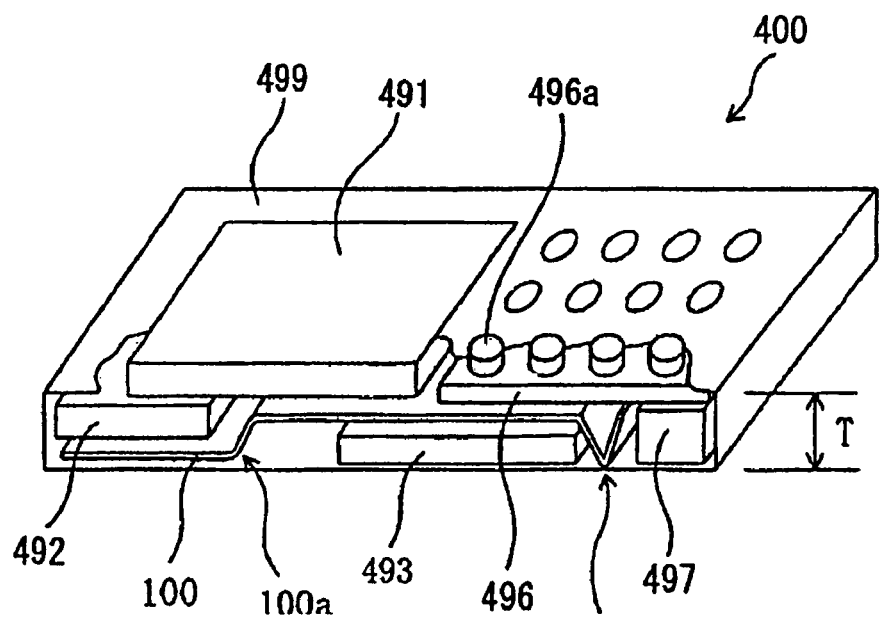
FIG. 45 shows a perspective view of a construction of an electronic device in which a flexible substrate is mounted as a circuit board.

In this thin cellular phone 400 shown in FIG. 45 (preferably extremely thin, and less than or equal to 2 to 6 μm in thickness T), the flexible substrate 100 is used as a circuit board. Instead of the flexible substrate 100, flexible substrate 200, multilayer flexible substrate 180, or flexible device 300 may be used as a circuit board of the cellular phone 400.

Within housing 499 of the cellular phone 400, a display unit 491 (e.g. LCD panel), key unit 496 (in which antenna 492, battery 493, and buttons 496a are mounted), camera unit 497 (e.g. CCD or CMOS image sensor) are mounted. In spite of a limited mounting region within the housing 499, it is possible to effectively use the flexible substrates 100, 200 having a better flexing life. The flexible substrate 100 serving as a circuit board can be relatively easily provided with curved sections (or flexural portions) 100a or clinched portions 100b, which in turn leads to achievement of a high-density mounting.

Hereinabove, although the present invention has been explained as above with reference to preferred embodiments, it will be understood by those skilled in the art that the present invention is not limited to such embodiments and can be modified in various ways. For example, in order to lower a cost of production processes (I) or (II) of the present invention, it is possible to use a commercially available laminate with metal layer instead of the sheet member, and preferably a copper-clad laminate is used.

As an additional remark, Japanese Patent Kokai Publication No. 3-201498, Japanese Patent Kokai Publication No. 49-27866, Japanese Patent Kokai Publication No. 55-102291, Japanese Patent Kokai Publication No. 9-283881, and Japanese Patent Kokai Publication No. 52-71677 will be hereinafter described, although inventions disclosed in those publications are fundamentally different from the present invention in terms of their technical meanings.

Japanese Patent Kokai Publication No. 3-201498 and Japanese Patent Kokai Publication No. 49-27866 disclose a technology wherein a part of a wiring pattern is crashed through an insulative layer and then connected to a metal substrate (e.g. aluminum substrate) without a screw tool for a purpose of ensuring an electrical connection between the wiring pattern and the metal substrate. As to such disclosed technology, a connecting tool is used to connect a part of the wiring pattern to the metal substrate. By use of this connecting tool, a relatively soft surface of an aluminum substrate is deeply caved. Thus, this disclosed technology cannot be employed for forming vias of a double-sided flexible substrate. Beyond that, no wiring pattern is formed in the metal plate (aluminum plate) serving as a radiator plate. Basically, what is disclosed in those publications are alternative technologies for connection with a screw, and therefore are fundamentally different from the present invention.

Japanese Patent Kokai Publication No. 55-102291 discloses a structure of a through-hole conductor of a flexible circuit board. Technology disclosed in this publication is an alternative technology for a process for making a conventional through hole, and therefore is fundamentally different from the present invention. Further, a structure of the through-hole conductor disclosed in this publication has a possibility of a less reliable connection from a structural standpoint. That is to say, as to this disclosed technology, a concern remains about reliability in terms of connection. A reason for this is that circuit wiring patterns formed on one surface and another surface are connected to each other at a so-called "shoulder position" of the through hole, and therefore a point-contact in a cross-sectional view and plane-contact in an overall view are conceivable. In contrast, as to an interlaminar junction of the present invention, a stable line-contact in a cross-sectional view and plane-contact in an overall view are conceivable. Therefore, in that respect, the technology disclosed in this publication is greatly different from the present invention. Incidentally, in a case of a plated through-hole, a disconnection of wiring tends to take place at the "shoulder position", and therefore it is required to take measures against such disconnection. Meanwhile, as to the flexible substrate of the present invention, stress occurred at a position corresponding to the above "shoulder position" is low. In such a light, they are also different from each other.

Figure 2:
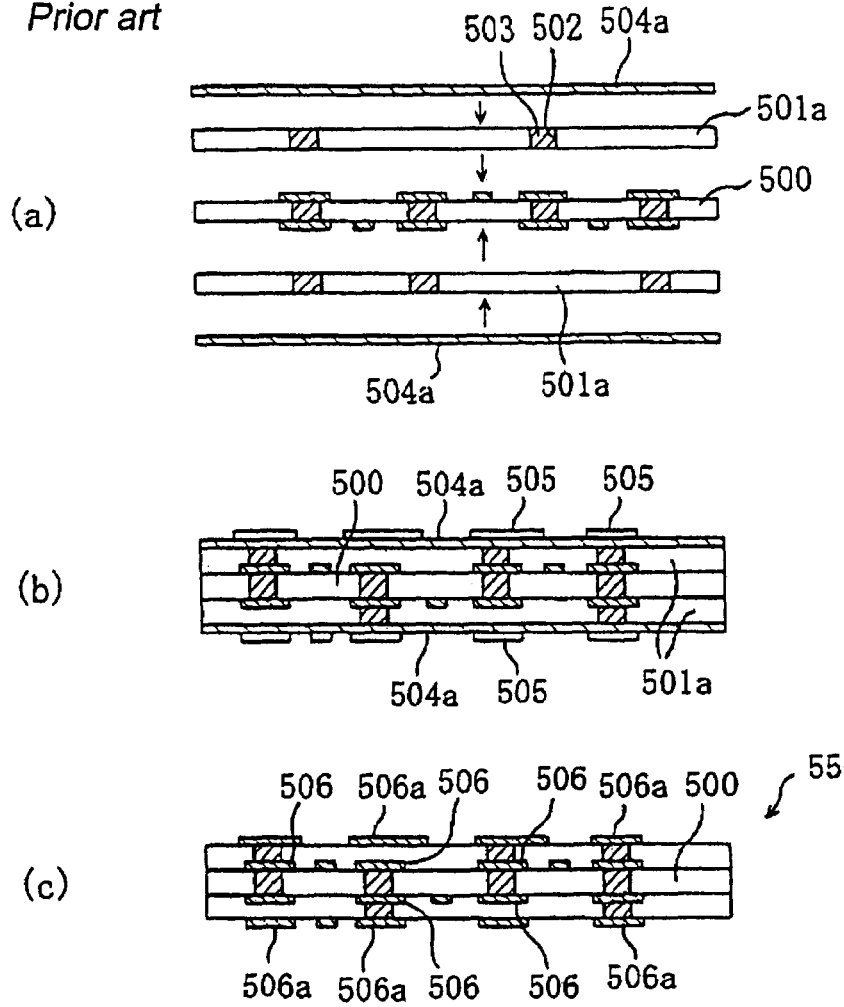
FIGS. 2(a) to 2(c) show cross-sectional views illustrating steps in a process for producing a conventional flexible substrate.

Japanese Patent Kokai Publication No. 9-283881 discloses a circuit board including pressure-welding vias. In this circuit board, a pressure-welding via is formed within a board by butting a part of wiring disposed in a front surface of the board. During formation of the pressure-welding via, a softening technique is performed with heat. For example, the pressure-welding via is formed by use of a pressure-plate that is heated with a heating medium (see FIG. 2 in this publication). Therefore, the board is to be considered limited to a board consisting of a thermoplastic resin, and therefore there is a possibility of a less preferable heat-resisting characteristic of the circuit board. Japanese Patent Kokai Publication No. 52-71677 discloses a method wherein circuit conductors formed on both faces of a print circuit board are electrically connected to each other. As to the print circuit board disclosed in this publication, the circuit conductors are formed on both surfaces of the insulating board consisting of a thermoplastic resin. Thus, such both-sided circuit conductors are pressed by heat-softening a spot to be connected, and thereby they are come close together. That is to say, they are spot-welded to each other. Therefore, as with Japanese Patent Kokai Publication No. 9-283881, an insulating board in the method disclosed in Japanese Patent Kokai Publication No. 52-71677 is considered limited to a board consisting of a thermoplastic resin, and therefore there is a possibility of a less preferable heat-resisting characteristic of the printed circuit board. In contrast, the flexible substrate of the present invention has a higher heat-resisting characteristic as a whole, because the flexible substrate is composed of a thermosetting resin and a heat-resisting film. Also, as for the structure of the flexible substrate of the present invention, wiring patterns are embedded in insulating resin layers and thereby a spacing between a front-sided wiring pattern and a rear-sided wiring pattern is small. Furthermore, a thin film (preferably a film made of an aramid suitable for forming a thin film) is used and thereby interlaminar junctions can be formed without heat-softening. As described above, the structure of the flexible substrate of the present invention is different from that of the circuit board and printed circuit board disclosed respectively in Japanese Patent Kokai Publication No. 9-283881 and Japanese Patent Kokai Publication No. 52-71677. In such a light, they are different from each other in terms of their technical meanings.

EXAMPLES

According to examples (1) to (3), experiments about a flexible substrate and a process for producing the same were performed.

First, according to examples (1) and (2), experiments concerning a flexing life of the flexible substrate of the present invention were performed.

Example 1

(Film Material)
A film (organic film) used in this example is shown in Table 1.

TABLE 1

| No. | FILM | NAME OF COMMODITY (MANUFACTURER) |
|---|---|---|
| 1a | ARAMID | [MICTRON] (TORAY Co., Ltd.) |
| 1b | ARAMID | [ARAMICA] (TEIJIN ADVANCED FILM Co., Ltd.) |
| 1c | PI | [KAPTON] (DU PONT-TORAY Co., Ltd.) |
| 1d | PI | [UPILEX] (UBE INDUSTRIES Co. Ltd.) |
| 1e | PEN | [TEONEX] (TEIJIN-DU PONT FILM Co. Ltd.) |
| 1f | PET | [TETRON] (TEIJIN-DU PONT FILM Co. Ltd.) |
| 1g | PPS | [TORELINA] (TORAY Co., Ltd) |
| 1h | PA | [HARDEN] (TOYOBO Co., Ltd) |
| 1i | PC | [PANLITE] (TEIJIN CHEMICALS Co., Ltd) |

TABLE 1-continued

| No. | FILM | NAME OF COMMODITY (MANUFACTURER) |
|---|---|---|
| 1j | PES | [SUMILITE FS-1300] (SUMITOMO BAKELITE Co., Ltd) |
| 1k | PEI | [SUPERIO UT] (MITSUBISHIPLASTICS, Inc.) |
| 1l | PPE | [DIANIUM] (MITSUBISHIPLASTICS, Inc.) |
| 1m | PEEK | [SUMILITE FS-1100C] (SUMITOMO BAKELITE Co., Ltd) |

(Preparation of the Substrate Used for Measuring Flexing Life)

By applying an epoxy-base thermosetting resin layer to both surfaces of the film with a roll coater process, insulating resin layers were formed. Subsequently, wiring patterns were embedded into the insulating resin layers.

Prior to embedding of the wiring patterns, a thin peel-apart layer (consisting of a nickel-phosphorus alloy) was prepared on both surfaces of an electrolytic copper foil having a thickness of 70 μm (which foil served as a supporting member of a wiring pattern), and then another copper foil (12 μm in thickness) was formed on the peel-apart layer by performance of an electroplating technique. After that, a wiring pattern was formed by superposing a dry film resist on this formed copper foil, followed by performing light exposure, development, etching, and removal of the resist in series.

Subsequently, the supporting member having the wiring pattern was superposed on the insulating resin layers formed on the front face and the rear face of the film with adjustment of a position, and therefore a wiring pattern of the supporting member was embedded into the insulating resin layer by heating to a temperature of 60° C. as well as pressing at a pressure of 3 MPa for 5 minutes. Subsequently, after cooling, only the supporting member was peeled off, followed by performing a real curing of the insulating resin layer by heating it for an hour under a condition of 140° C. and 5 MPa. In this way, a substrate (i.e. sample substrate), which is regarded as a base member for the flexible substrate, was obtained. Specifications of this obtained substrate is shown in the following Table 2.

(Measurement of Flexing Life)

Based on the technique of IPC-240C and JIS-C5016, a flexing life for various types of sample substrates was measured.

Prior to this measurement, each sample substrate was fixed between two flat plates that were respectively opposed at a certain distance in such a manner that the sample substrate was folded at 180 degrees so as to achieve a constant curvature. Subsequently, the two flat plates were moved towards each other in parallel at a predetermined speed and stroke. That is to say, the sample substrate was repeatedly slid and moved relative to the two flat plates so that a reciprocating motion thereof was performed. During that, a direct current resistance of the wiring patterns located at a curved inner surface of the sample substrate was monitored. The flexing life was regarded as a cycle number of the reciprocating motion wherein the resistance was increased by 80% compared with an initial resistance. By way of comparison, a flexing life of copper foil used for the wiring pattern (i.e. copper foil having a thickness of 12 μm, and which was formed by performing an electroplating technique) was also measured with a similar method to the above example.

(Result)

Figure 46:
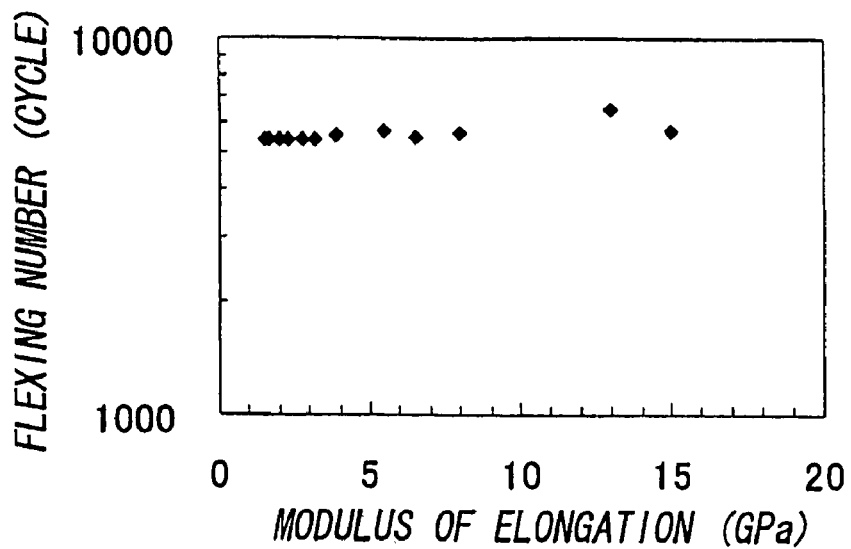
FIG. 46 is a graph that shows an elongation modulus of a film versus a flexing number.

A result of this example is shown in FIG. 46. FIG. 46 is a graph that shows a modulus of elongation of a film versus a number of flexings (=flexing life) at room temperature. A comparative example showed that a rupture occurred at 800 cycles of the reciprocating motion. Considering that along with reference to FIG. 46, it is understood that the substrate, which is considered as a base member for the flexible substrate of the present invention, has a preferable flexing life irrespective of its modulus of elongation. A reason for this is that, due to the wiring patterns being buried in the insulating resin layers, an applied stress tends to be dispersed by the insulating resin layer that retains the wiring pattern, which in turn prevents development of a microcrack that may occur in the wiring pattern.

Example 2

(Preparation of a Substrate Used for Measuring Flexing Life)

In this example, by using a method similar to that of above example (1), various types of sample substrates were pre-

TABLE 2

| | | THICKNESS (μm) | | | | MODULUS OF ELASTICITY (GPa) | |
|---|---|---|---|---|---|---|---|
| No. | ORGANIC FILM | WIRING PATTERN | INSULATING RESIN LAYER (ON ONE SURFACE OF FILM) | FILM | SUBSTRATE | INSULATING RESIN LAYER | FILM |
| 1a | ARAMID | 12 | 15 | 12 | 42 | 0.8 | 13 |
| 1b | ARAMID | 12 | 15 | 12 | 42 | 0.8 | 15 |
| 1c | PI | 12 | 15 | 12 | 42 | 0.8 | 3.2 |
| 1d | PI | 12 | 15 | 12 | 42 | 0.8 | 8 |
| 1e | PEN | 12 | 15 | 12 | 42 | 0.8 | 6.5 |
| 1f | PET | 12 | 15 | 12 | 42 | 0.8 | 5.5 |
| 1g | PPS | 12 | 15 | 12 | 42 | 0.8 | 3.9 |
| 1h | PA | 12 | 15 | 12 | 42 | 0.8 | 1.5 |
| 1i | PC | 12 | 15 | 12 | 42 | 0.8 | 2.3 |
| 1j | PES | 12 | 15 | 12 | 42 | 0.8 | 2 |
| 1k | PEI | 12 | 15 | 12 | 42 | 0.8 | 2.8 |
| 1l | PPE | 12 | 15 | 12 | 42 | 0.8 | 1.7 |
| 1m | PEEK | 12 | 15 | 12 | 42 | 0.8 | 3.2 | pared in such a manner that a ratio of insulating resin layer thickness/film thickness is diversely changed. Specifications of prepared substrates are shown in the following Table 3.

TABLE 3

| | | THICKNESS (μm) | | | | MODULUS OF ELASTICITY (GPa) | | |
| --- | --- | --- | --- | --- | --- | --- | --- | --- |
| No. | ORGANIC FILM | WIRING PATTERN | INSULATING RESIN LAYER (ON ONE SURFACE OF FILM) | FILM | SUBSTRATE | INSULATING RESIN LAYER | FILM | INSULATING RESIN LAYER THICKNESS/ FILM THICKNESS |
| 2a | ARAMID | 3 | 12 | 4 | 28 | 0.8 | 13 | 3.0 |
| 2b | ARAMID | 3 | 11 | 6.5 | 28.5 | 0.8 | 13 | 1.7 |
| 2c | ARAMID | 3 | 9.5 | 9 | 28 | 0.8 | 13 | 1.1 |
| 2d | ARAMID | 3 | 8 | 12 | 28 | 0.8 | 13 | 0.7 |
| 2e | ARAMID | 3 | 6 | 16 | 28 | 0.8 | 13 | 0.4 |
| 2f | ARAMID | 3 | 6 | 9 | 21 | 0.8 | 13 | 0.7 |
| 2g | ARAMID | 3 | 12 | 9 | 33 | 0.8 | 13 | 1.3 |

(Test Condition)

All of the films used in this example were aramid films ("MICTRON" manufactured by TORAY Co., Ltd.) Sample substrates 2a to 2e were approximately same in thickness thereof, and sample substrates 2c, 2f, and 2g were same in thickness of the film. A flexing life of such sample substrates was measured by using a method similar to that of above example (1). As another test condition, speed (i.e. frequency) was 25 Hz, a stroke was 25 mm, and a curvature radius was 2 mm, 4 mm and 8 mm.

(Result)

Figure 47:
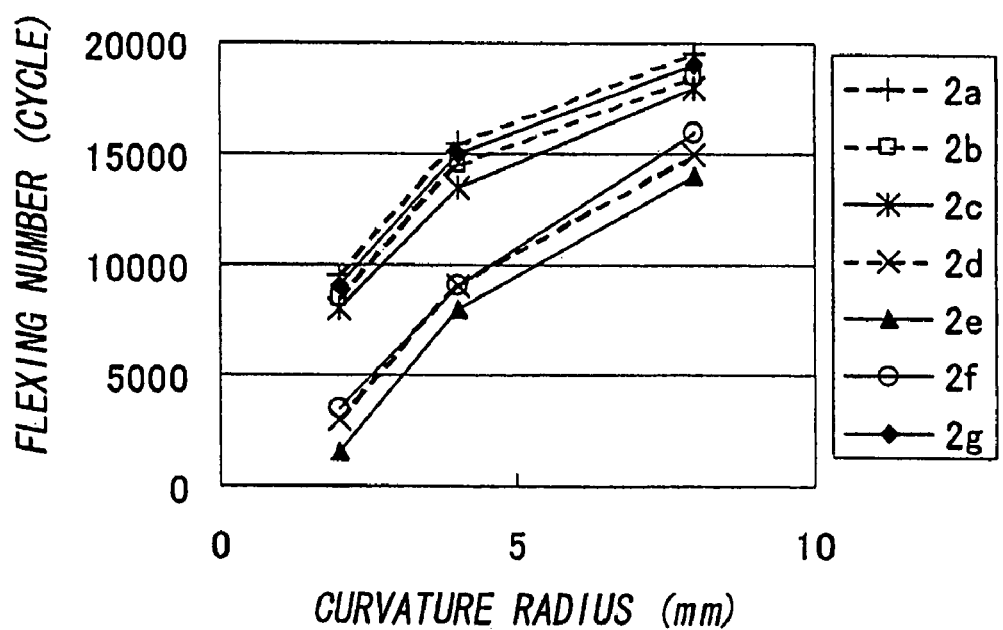
FIG. 47 is a graph that shows a curvature radius versus a flexing number.
Figure 48:
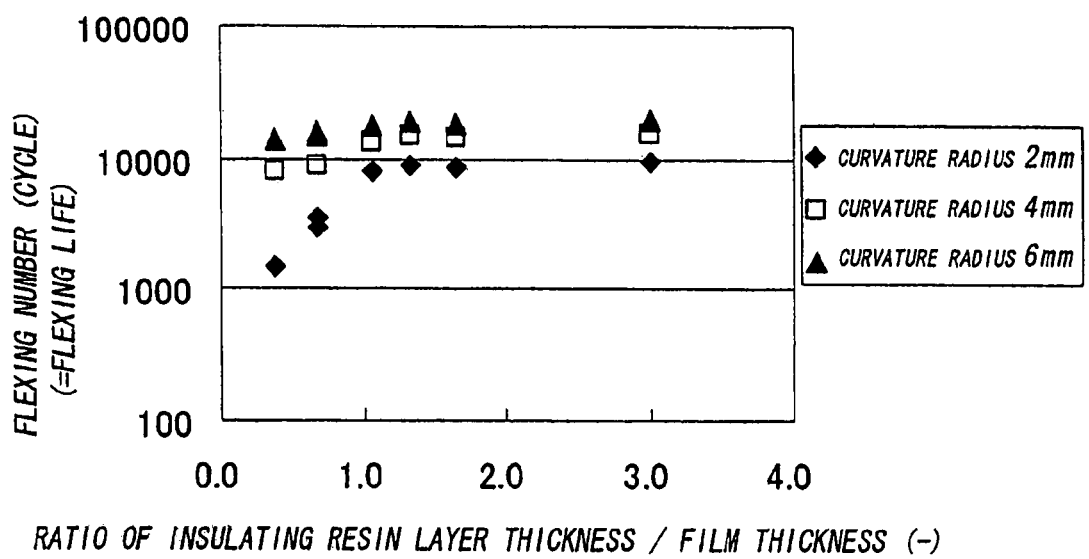
FIG. 48 is a graph that shows a ratio of an insulating resin layer thickness/film thickness versus a flexing number.

Results of example (2) are shown in FIGS. 47 and 48. FIG. 47 is a graph that shows a curvature radius versus a flexing number (=flexing life). FIG. 48 is a graph that shows a ratio of an insulating resin layer thickness to a film thickness (=insulating resin layer thickness/film thickness) versus a flexing number (=flexing life). With reference to these graphs, it is understood that a flexible life of a sample substrate is better in a case where the insulating resin layer is thicker than the film, and that the smaller a curvature radius becomes, the more distinctive a feature concerning flexible life becomes. A reason for this is that stress applied on the wiring pattern and the film is supposed to be alleviated by the insulating resin layer having a low modulus of elasticity.

Example 3

In this example, an effect of a pressure-joint performed in a production process of the present invention was confirmed. And also, an effect of an application of the ultrasonic wave to interlaminar junctions was confirmed.

(Preparation of a Substrate Used for Example (3))

As with example (1), a film on both surfaces of which insulating resin layers were formed was prepared, and also two carrier sheets (i.e. copper foils that were respectively 70 μm in thickness) in which wiring patterns were formed were prepared. The film used in example (3) was aramid film ("MICTRON" manufactured by TORAY Co., Ltd.) being 4 μm in thickness. Each of insulating resin layers formed on both surfaces of the film was 10 μm in thickness. Each of the wiring patterns on the carrier sheets was formed by performance of an electroplating technique in such a manner that a thickness of the wiring pattern was 9 μm. Subsequently, each of the carrier sheets on which the wiring patterns were preliminarily formed was superposed on front-sided and rear-sided insulating resin layers of the film with adjustment of position, and thereafter each of wiring patterns was embedded into each of the insulating resin layers by heating to a temperature of 60° C. as well as pressing at a pressure of 3 MPa for 5 minutes. After cooling, only carrier sheets were peeled off. In this way, a pre-cured sheet member in which front-sided and rear-sided wiring patterns were formed was obtained. Here, each of the wiring patterns used was something like that providing a so-called "chain-via" in which electrodes formed on the both surfaces of the substrate were connected and jointed to each other within the substrate. In this regard, a diameter of each electrode for forming an interlaminar junction was 600 μm.

(Formation of Interlaminar Junctions)

Subsequently, by pressing the electrode formed on one surface of the pre-cured sheet member toward an interior thereof, opposed electrodes were jointed to each other within the substrate. Consequently, interlaminar junctions were formed in such a manner that 100 interlaminar junctions were coupled to each other. In this regard, a needle-like cylindrical member (a tip thereof was hemispherical in shape) was used as a pressing tool, which member was made of stainless material and 100 μm in thickness. After pressing, real curing was performed by heating for an hour under a condition of a temperature of 140° C. as well as a pressure of 5 MPa. In this way, a flexible substrate in which chain-vias (i.e. interlaminar junctions) was formed was obtained.

(Preparation of a Flexible Substrate Treated by an Ultrasonic Wave)

By use of an ultrasonic applying tool (ULTRASONIC ENGINEERING Co., Ltd., type: USW-610Z20S), ultrasonic vibration was applied to interlaminar junctions (i.e. chain-via) via electrodes of a flexible substrate. As a result of that, a flexible substrate treated by an ultrasonic wave was obtained. In this regard, the ultrasonic vibration was 28 kHz, and a generating power was 200 W.

(Measurement of Resistance)

First, resistances of the chain-vias of the above two types of flexible substrates (i.e. one is an ultrasonic-wave treated flexible substrate and the other is a ultrasonic-wave non-treated flexible substrate) were measured by performing a four-terminal measurement. Next, subsequent to measuring a resistance of wiring, such resistance of the wiring was subtracted from a resistance of the chain-vias in order to obtain a resistance of each interlaminar junction. In this regard, the resistance of each interlaminar junction was obtained as an average value of ten samples for each flexible substrate prepared. As to measurement of the wiring resistance, wiring patterns were formed in such a manner that they had the same wiring length and wiring width as wiring regions where no interlaminar junction existed, and thereafter a resistance of such wiring patterns was measured by performance the four-terminal measurement.

(Result)

Figure 49:
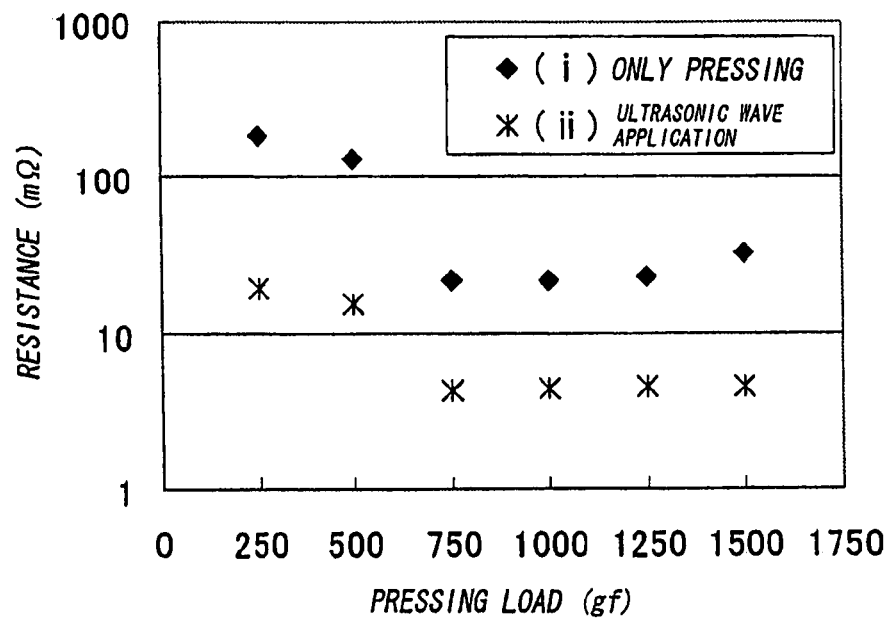
FIG. 49 is a graph that shows a pressing load versus a resistance.

FIG. 49 shows a resistance per interlaminar junction with a change of a pressing load. With reference to FIG. 49, it was found that the resistance became close to a certain level in a case where a pressing load above a certain level was applied. Also, it was found that application of the ultrasonic wave caused the resistance of each interlaminar junction to lower to a level less than half that before an application thereof.

(Liquid Bath Type Thermal Shock Test)

Subsequently, a liquid bath type thermal shock test was performed as to sample substrates prepared with a constant pressing load of 750 gf. Ten samples for each of two types of substrates were employed. Regarding a 5-minute exposure of a sample substrate to two liquid baths respectively having temperatures of 55° C. and 125° C. as 1 cycle, such cycles up to 2000 were performed for each sample substrate. After the above exposure, a resistance of an interlaminar junction was measured. In this regard, the sample substrate in which a resistance change of more than or equal to 10% occured was regarded as "defective". A result was as follows: a percent of defectives for the ultrasonic-wave non-treated flexible substrate exposed at 1000 cycles was 0%; a percent of defectives for the ultrasonic-wave non-treated flexible substrate exposed at 2000 cycles was 20%; a percent of defectives for the ultrasonic-wave treated flexible substrate exposed at 1000 cycles was 0%; a percent of defectives for the ultrasonic-wave treated flexible substrate exposed at 2000 cycles was 0%. Hereinabove, a beneficial effect of the flexible substrate of the present invention was confirmed.

(General Overview)

The following matters were derived from example (3) (however, these matters may be altered to suit a design condition of the flexible substrate):

It is preferred that a frequency of the ultrasonic vibration is approximately in the range of between 15 kHz and 150 kHz. A reason for this is that an ultrasonic vibration above such range will cause too large a generating power, which in turn leads to an unfavorable condition concerning high-precision processing, whereas an ultrasonic vibration below such range will cause too small a generating power, which in turn leads to insufficient melting.

It is preferred that the generating power is approximately in the range between 10 W and a few thousand W. A reason for this is also that a generating power above such range will lead to an unfavorable condition concerning a high-precision processing, whereas a generating power below such range will lead to an insufficient melting.

It is preferred that an applying time is in the range between 0.1 seconds and 10 seconds (typically about 1 second), which corresponds to applying energy of 1 kJ to a few KJ.

INDUSTRIAL APPLICABILITY

The flexible substrate, multilayer flexible substrate, and flexible device, all of which are obtained by a production process of the present invention, can be used as a circuit board of a cellular phone. However, when not applied to the cellular phone, they can be used for a PDA or a notebook computer. Furthermore, they can be used for a digital still camera or a wall-hung thin-shaped television (i.e. flat-panel display). As use of a flexible substrate in more various fields progresses, it is conceivable that a technical value of the flexible substrate (in particular the multilayer flexible substrate) of the present invention will increase more than ever.

CROSS REFERENCE TO RELATED PATENT APPLICATION

The present application claims the right of priority of Japanese Application No. 2004-079848 (filed Mar. 19, 2004, the title of the invention: "FLEXIBLE SUBSTRATE, MULTILAYER FLEXIBLE SUBSTRATE, FLEXIBLE DEVICE, ELECTRONICS DEVICE, AND PROCESS FOR PRODUCING THE SAME"), Japanese Application No. 2004-088853 (filed Mar. 25, 2004, the title of the invention: "FLEXIBLE SUBSTRATE, MULTILAYER FLEXIBLE SUBSTRATE, FLEXIBLE DEVICE, AND PROCESS FOR PRODUCING FLEXIBLE SUBSTRATE"), Japanese Application No. 2004-088854 (filed Mar. 25, 2004, the title of the invention: "FLEXIBLE SUBSTRATE, FLEXIBLE DEVICE, AND PROCESS FOR PRODUCING FLEXIBLE SUBSTRATE"), Japanese Application No. 2004-318887 (filed Nov. 2, 2004, the title of the invention: "PROCESS FOR PRODUCING FLEXIBLE SUBSTRATE, FLEXIBLE SUBSTRATE, FLEXIBLE DEVICE, AND CIRCUIT BOARD MODULE"), Japanese Application No. 2004-318888 (filed Nov. 2, 2004, the title of the invention: "PROCESS FOR PRODUCING FLEXIBLE SUBSTRATE, AND FLEXIBLE SUBSTRATE, FLEXIBLE DEVICE"), the disclosures of which are all incorporated herein by reference.

What is claimed is:

1. A flexible substrate comprising:
   a first sheet member;
   a second sheet member; and
   a substrate having a first wiring pattern formed on a front face thereof and a second wiring pattern formed on a rear face thereof, said rear face being opposite to said front face,
   wherein said first sheet member comprises
      a first film,
      a first insulating resin layer formed on each of a front face of said first film and a rear face of said first film, said rear face being opposite to said front face, and
      a first wiring pattern embedded in said first insulating resin layer formed on said front face of said first film, said first wiring pattern being flush with said first insulating resin layer,
   wherein said first sheet member is stacked on said substrate such that said first insulating resin layer formed on said rear face of said first film of said first sheet member is in contact with said front face of said substrate,
   wherein a part of said first wiring pattern of said first sheet member is dented toward said substrate so that said part of said first wiring pattern of said first sheet member and a part of said first wiring pattern of said substrate are jointed to each other to form a junction,
   wherein said second sheet member comprises
      a second film,
      a second insulating resin layer formed on each of a front face of said second film and a rear face of said second film, said rear face being opposite to said front face, and
      a second wiring pattern embedded in said second insulating resin layer formed on said front face of said second film,
   wherein said first sheet member is stacked on said front face of said substrate and said second sheet member is stacked on said rear face of said substrate, and wherein a part of said second wiring pattern of said second sheet member is dented toward said substrate, so that said part of said first wiring pattern of said first sheet member stacked on said front face of said substrate and said part of said second wiring pattern of said second sheet member stacked on said rear face of said substrate are respectively jointed with said part of said first wiring pattern formed on said front face of said substrate and a part of said second wiring pattern formed on said rear face of said substrate.

2. The flexible substrate according to claim 1, wherein a cross section of said part of said first wiring pattern of said first sheet member has a "U" shape.

3. The flexible substrate according to claim 1, wherein said first film is thinner than said first insulating resin layer.

4. The flexible substrate according to claim 3, wherein a ratio of a thickness of said first film to a thickness of said first insulating resin layer is 1.2 to 6.

5. The flexible substrate according to claim 1, wherein said first film is made of an aramid.

6. The flexible substrate according to claim 1, wherein a surface of said first wiring pattern of said first sheet member has a concave portion formed due to the dent, said concave portion being filled with a conductive member so that said surface of said first wiring pattern of said first sheet member is flat.

7. The flexible substrate according to claim 1, wherein said junction is treated with an ultrasonic wave.

8. A multilayer flexible substrate comprising a plurality of flexible substrates laminated together, wherein at least one of said flexible substrates is said flexible substrate according to claim 1.

9. A flexible device comprising:
said multilayer flexible substrate according to claim 8; and
a semiconductor chip mounted on a wiring pattern located at a surface of said multilayer flexible substrate.

10. A flexible device comprising:
said multilayer flexible substrate according to claim 8; and
an electronic component included within at least one of said flexible substrates of said multilayer flexible substrate.

11. An electronics device comprising said multilayer flexible substrate according to claim 8 as a circuit board.

\* \* \* \* \*